US012302766B2

(12) United States Patent
Russell et al.

(10) Patent No.: US 12,302,766 B2
(45) Date of Patent: May 13, 2025

(54) SPARSE PIERS FOR THREE-DIMENSIONAL MEMORY ARRAYS

(71) Applicant: Micron Technology, Inc., Boise, ID (US)

(72) Inventors: Stephen W. Russell, Boise, ID (US); Enrico Varesi, Milan (IT); David H. Wells, Boise, ID (US); Paolo Fantini, Vimercate (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 463 days.

(21) Appl. No.: 17/656,280

(22) Filed: Mar. 24, 2022

(65) Prior Publication Data

US 2023/0309426 A1    Sep. 28, 2023

(51) Int. Cl.
| H10B 63/10 | (2023.01) |
| G11C 13/00 | (2006.01) |
| H10B 63/00 | (2023.01) |
| H10D 64/01 | (2025.01) |
| H10N 70/00 | (2023.01) |
| H01L 21/02 | (2006.01) |

(52) U.S. Cl.
CPC ....... H10N 70/826 (2023.02); G11C 13/0028 (2013.01); H10B 63/84 (2023.02); H10D 64/017 (2025.01); H10N 70/021 (2023.02); H10N 70/841 (2023.02); H10N 70/882 (2023.02); G11C 13/003 (2013.01); G11C 2213/71 (2013.01); G11C 2213/78 (2013.01); H01L 21/02507 (2013.01); H10B 63/10 (2023.02); H10B 63/845 (2023.02)

(58) Field of Classification Search
None
See application file for complete search history.

(56) References Cited

U.S. PATENT DOCUMENTS

| 9,911,790 B1* | 3/2018 | Shimabukuro | H10N 70/011 |
| 2022/0122976 A1* | 4/2022 | Kim | H10B 12/482 |
| 2022/0336015 A1* | 10/2022 | Fantini | G11C 8/14 |
| 2022/0359716 A1* | 11/2022 | Graettinger | H01L 27/0688 |
| 2024/0196765 A1* | 6/2024 | Graettinger | H10B 63/845 |

* cited by examiner

Primary Examiner — Nicholas J Tobergte
Assistant Examiner — William Henry Anderson
(74) Attorney, Agent, or Firm — Holland & Hart LLP

(57) ABSTRACT

Methods, systems, and devices for sparse piers for three-dimensional memory arrays are described. A semiconductor device, such as a memory die, may include pier structures formed in contact with features formed from alternating layers of materials deposited over a substrate, which may provide mechanical support for subsequent processing. For example, a memory die may include alternating layers of a first material and a second material, which may be formed into various cross-sectional patterns. In some examples, the alternating layers may be formed into one or more pairs of interleaved comb structures. Pier structures may be formed in contact with the cross sectional patterns to provide mechanical support between instances of the cross-sectional patterns, or between layers of the cross-sectional patterns (e.g., when one or more layers are removed from the cross-sectional patterns), or both.

12 Claims, 21 Drawing Sheets

TOP VIEW

SECTION D-D

SECTION A-A

Unselected Memory Cell 105 ▪ Selected Memory Cell 105-a

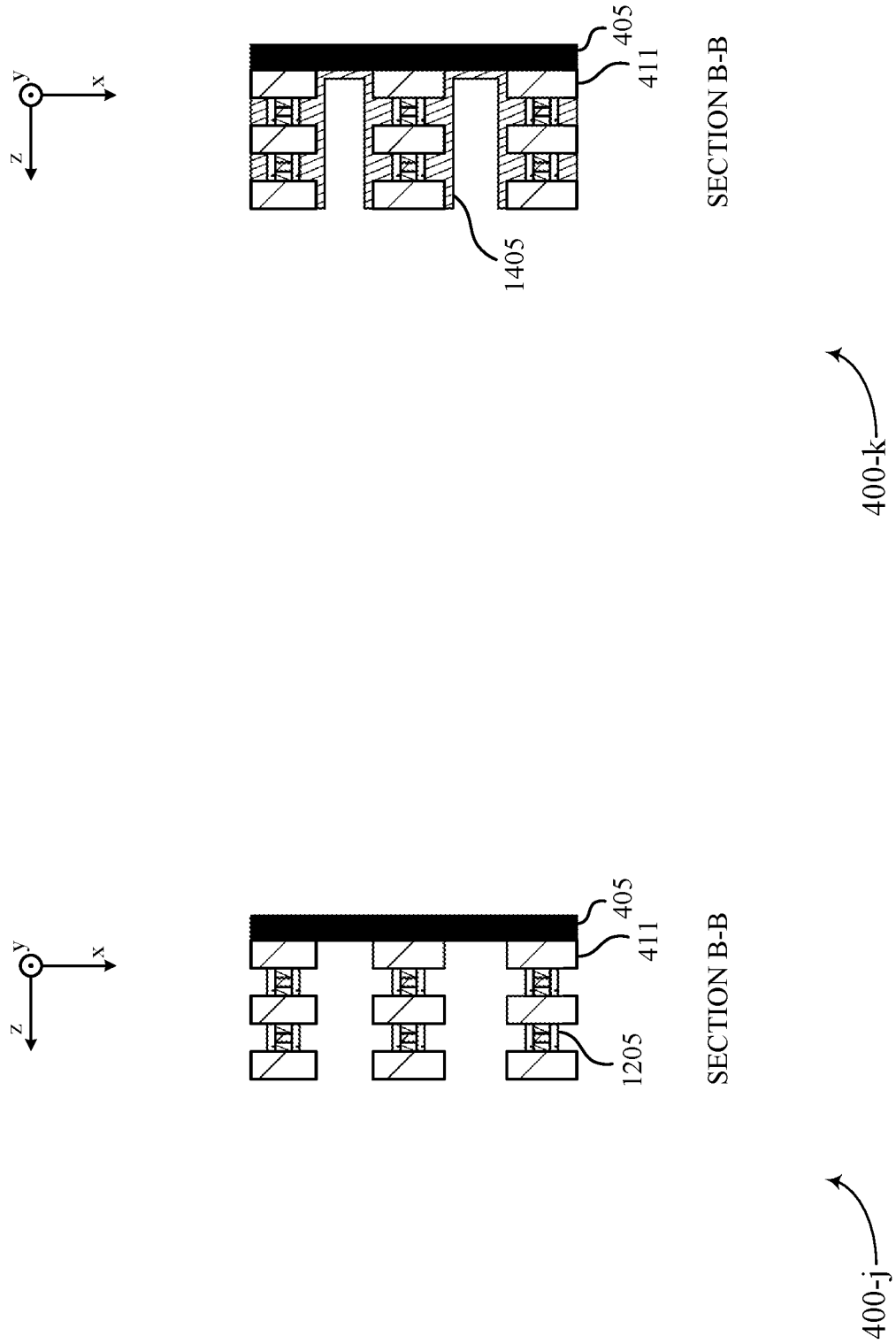

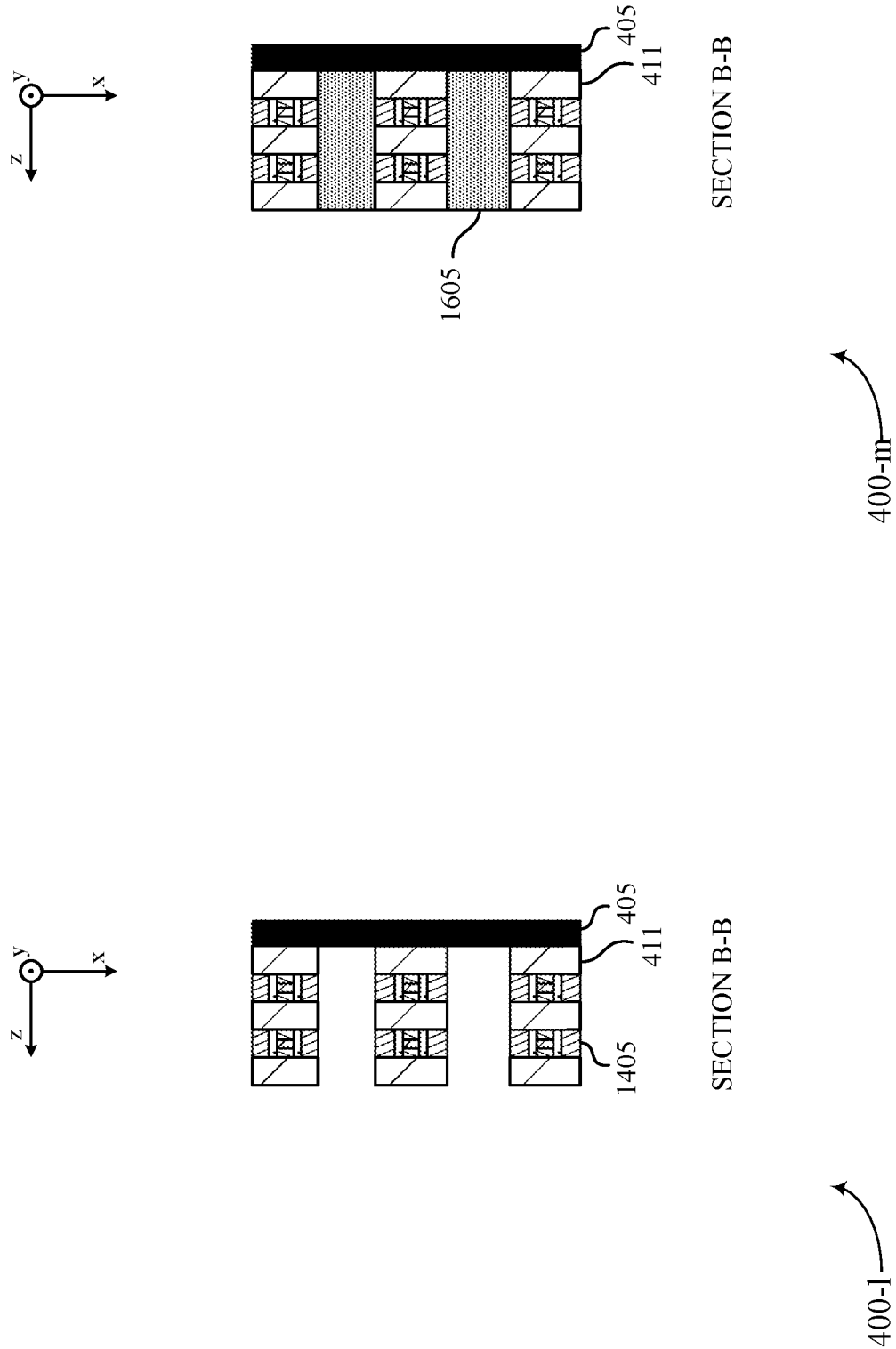

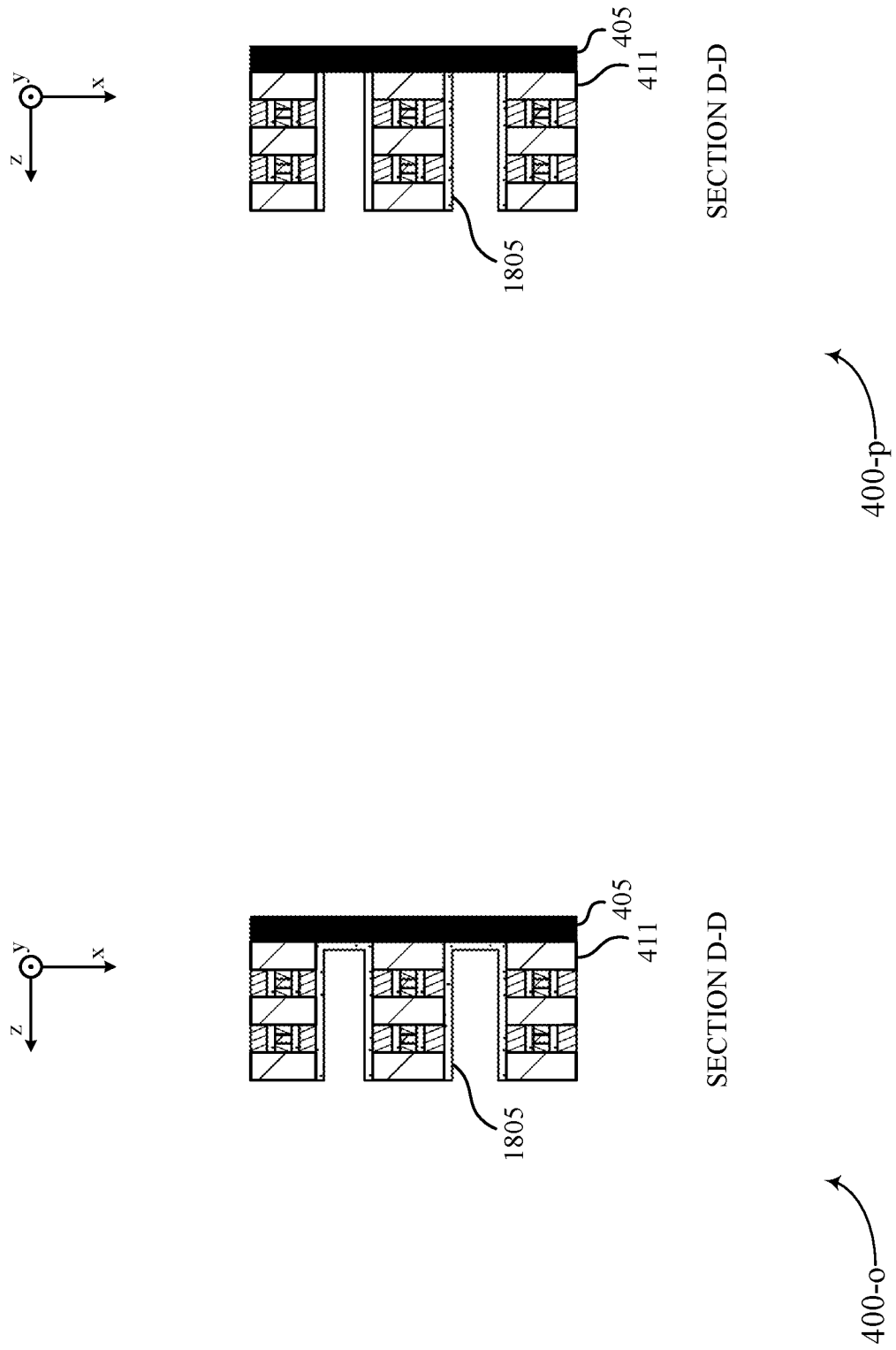

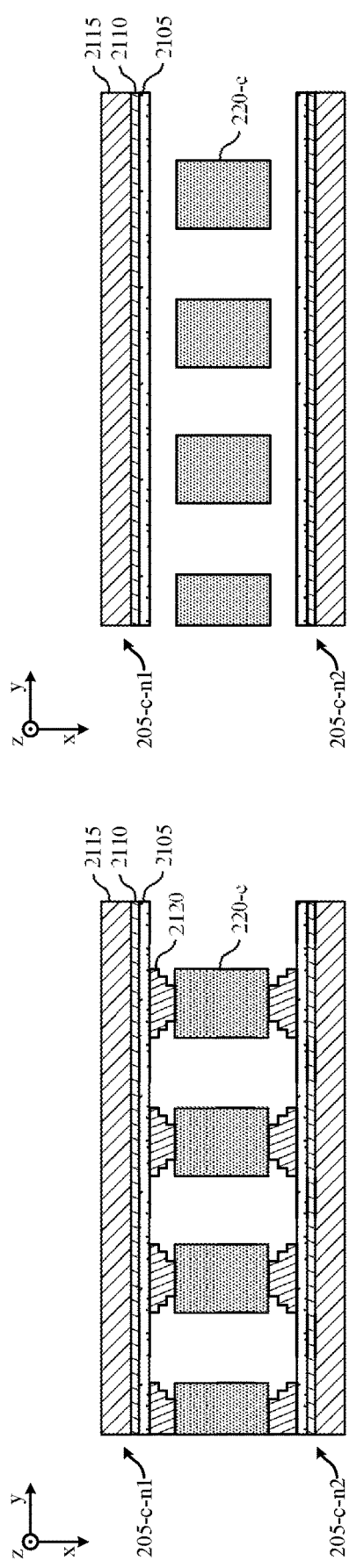
FIG. 22
FIG. 21
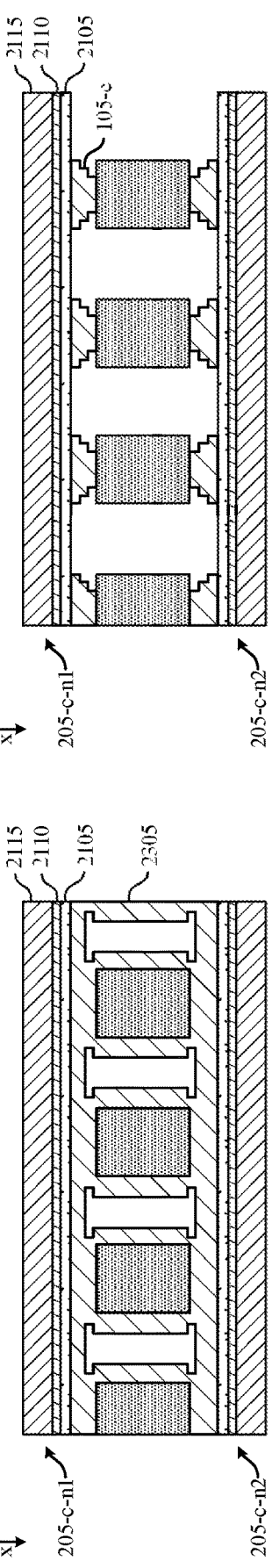
FIG. 24
FIG. 23

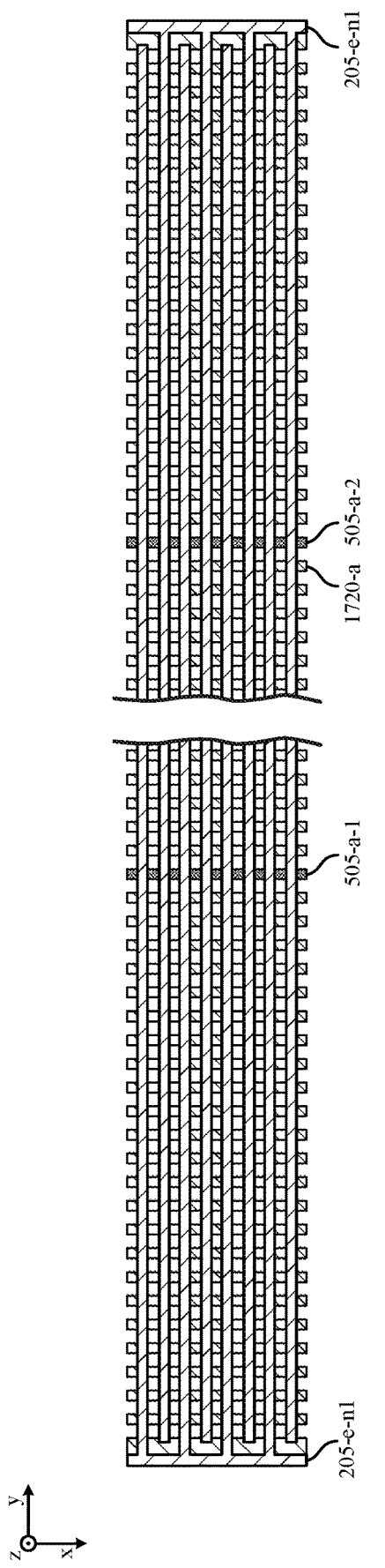
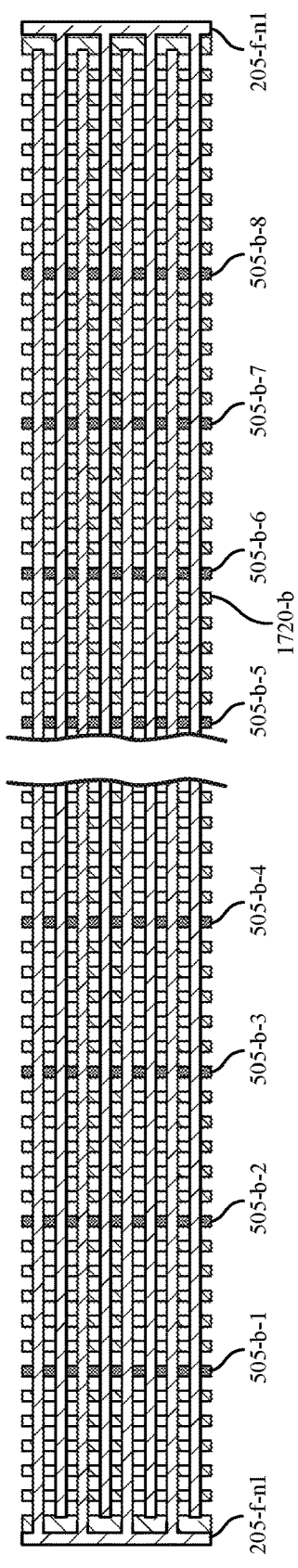
FIG. 29A
FIG. 29B

SPARSE PIERS FOR THREE-DIMENSIONAL MEMORY ARRAYS

FIELD OF TECHNOLOGY

The following relates to one or more systems for memory, including sparse piers for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 4 through 20 illustrate examples of operations that support sparse piers for three-dimensional memory arrays in accordance with examples as disclosed herein.

FIGS. 21 through 24 illustrate a first example for forming memory cells in a material arrangement that supports sparse piers for three-dimensional memory arrays in accordance with examples as disclosed herein.

FIGS. 29A and 29B illustrate example of layouts that support sparse piers for three-dimensional memory arrays in accordance with examples as disclosed herein.

DETAILED DESCRIPTION

In some semiconductor manufacturing operations, voids may be formed between layers of material deposited over a substrate, and other materials may be deposited in the voids (e.g., between the layers of material) to form various circuit structures. For example, in some memory applications, voids may be formed between layers of a dielectric material, and features of a memory array, such as access lines or memory cells (e.g., of different levels of the memory array), may be formed from materials deposited between the layers of the dielectric material. However, in some examples, features formed from the layers of dielectric material may lack sufficient mechanical support for subsequent processing, which may be associated with mechanical instability (e.g., buckling, deformation) of the features formed from the layers of dielectric material during processing. In some examples, such mechanical instability may lead to poor tolerances or failure to implement circuit structures of a semiconductor device, among other issues.

In accordance with examples as disclosed herein, a semiconductor device (e.g., a memory die) may include pier structures formed in contact with features formed from alternating layers of materials deposited over a substrate, which may provide mechanical support for subsequent processing. For example, a memory die may include alternating layers of a first material and a second material, which may be formed into various cross-sectional patterns. In some examples, the alternating layers may be formed into a pair of interleaved comb structures. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the cross-sectional patterns themselves or voids within the cross-sectional patterns may be formed with improved stability or tolerances, such that subsequent formation of features (e.g., circuit structures, access lines, memory cells) may be performed with reduced variability or otherwise improved consistency.

Features of the disclosure are initially described in the context of memory devices and arrays with reference to FIGS. 1, 2, 3A, and 3B. Features of the disclosure are described in the context of material arrangements and related manufacturing operations with reference to FIGS. 4 through 29B. These and other features of the disclosure are further illustrated by and described with reference to an apparatus diagram and flowcharts that relate to sparse piers for three-dimensional memory arrays as described with reference to FIGS. 30 and 31.

Figure 1:
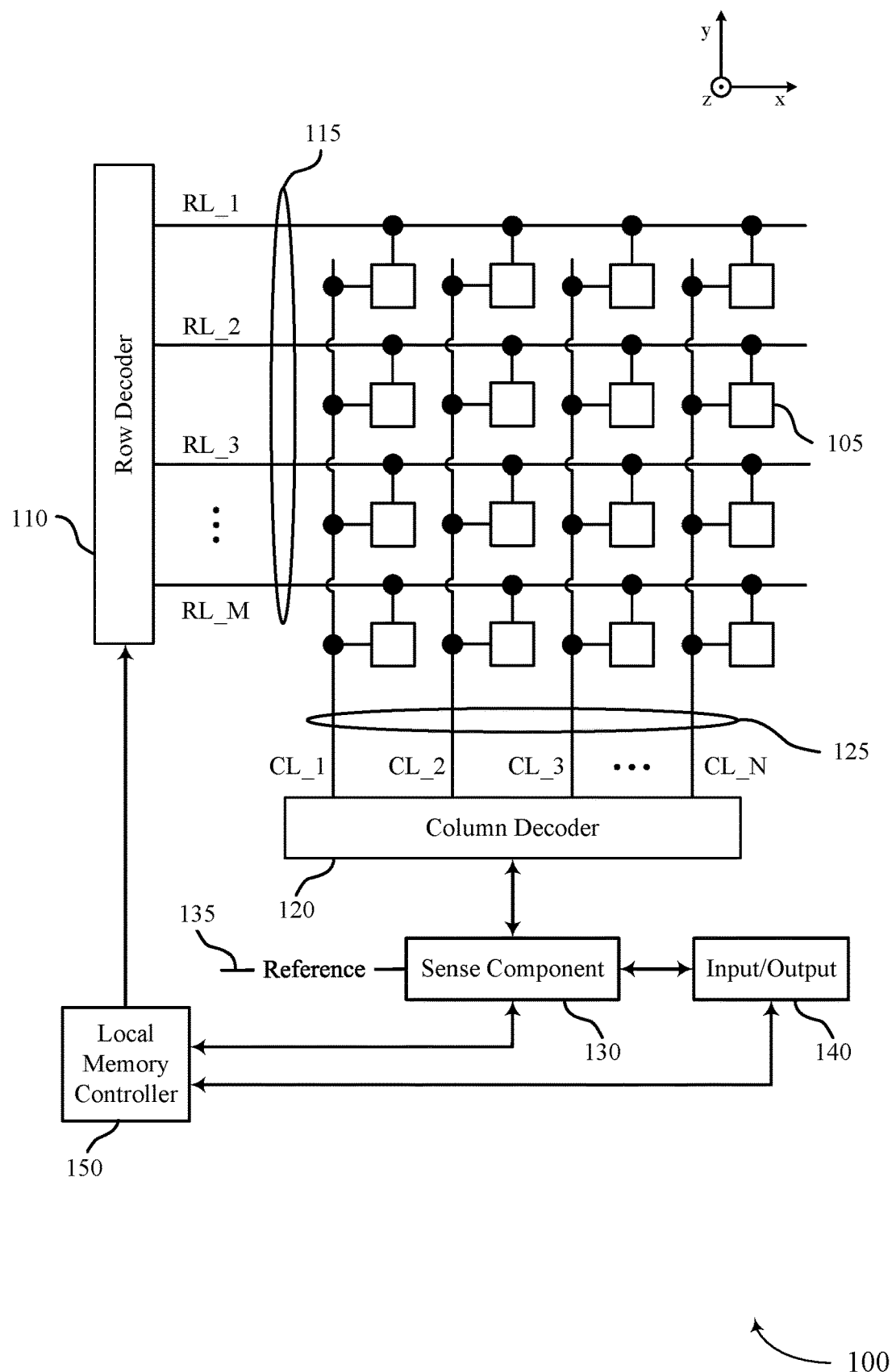
FIG. 1 illustrates an example of a memory array that supports sparse piers for three-dimensional memory arrays in accordance with examples as disclosed herein.

FIG. 1 illustrates an example of a memory device 100 that supports sparse piers for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some techniques for manufacturing a memory device 100 (e.g., for manufacturing a semiconductor die that includes one or more aspects of the memory device 100), voids may be formed between layers of material deposited over a substrate, and other materials may be deposited in the voids (e.g., between the layers of material) to form various circuit structures. For example, voids may be formed between layers of a dielectric material, and features of a memory array, such as access lines or memory cells 105 (e.g., of different levels of the memory array), may be formed from materials deposited between the layers of the dielectric material. However, in some examples, features formed from the layers of dielectric material may lack sufficient mechanical support for subsequent processing, which may be associated with mechanical instability (e.g., buckling, deformation) of the features formed from the layers of dielectric material during processing. In some examples, such mechanical instability may lead to poor tolerances or failure to implement circuit structures of the memory device 100, among other issues.

In accordance with examples as disclosed herein, a memory die that includes one or more aspects of the memory device 100 may include pier structures formed in contact with features formed from alternating layers of materials deposited over a substrate, which may provide mechanical support for subsequent processing. For example, a memory die may include alternating layers of a first material and a second material, which may be formed into various cross-sectional patterns. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the cross-sectional patterns themselves or voids formed within the cross sectional patterns may be formed with improved stability or tolerances, such that subsequent formation of features (e.g., circuit structures, access lines, memory cells 105) may be performed with reduced variability or otherwise improved consistency.

Figure 2:
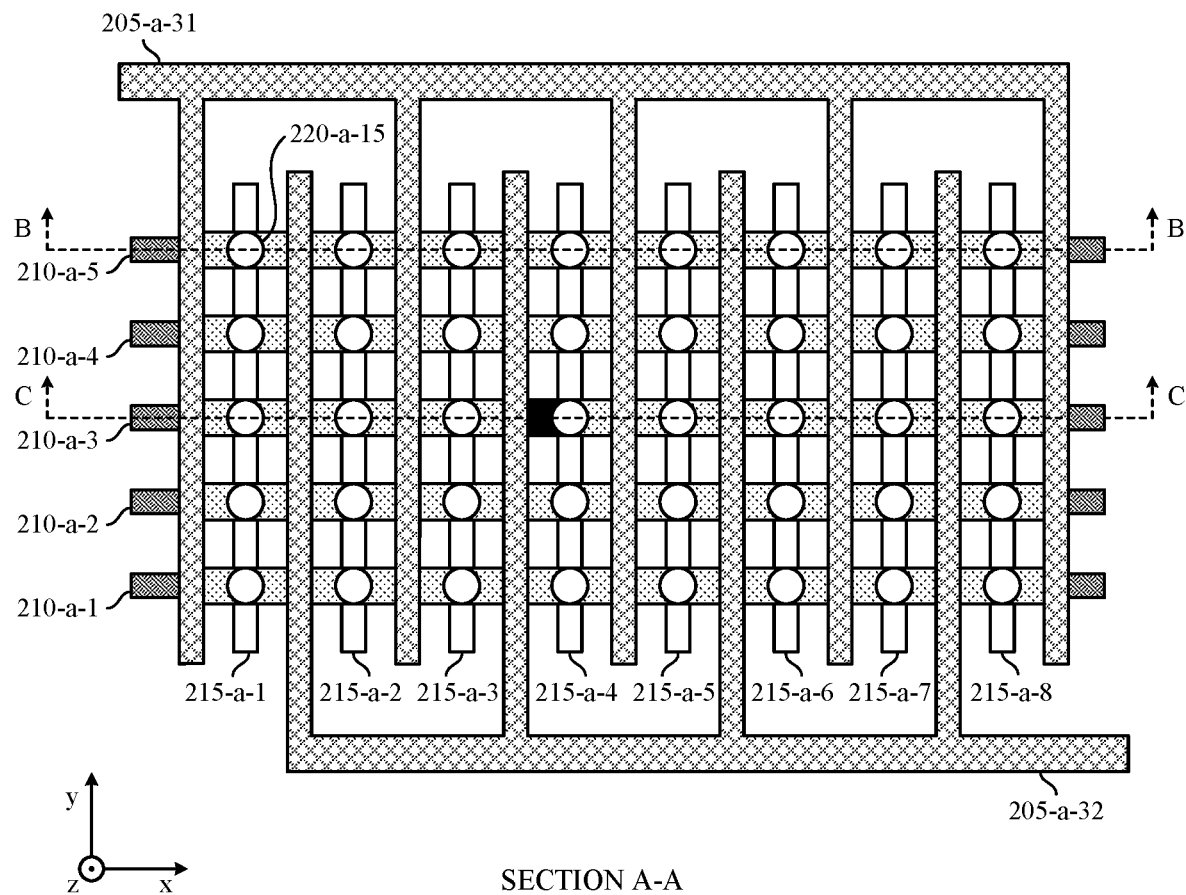
FIG. 2 illustrates a top view of an example of a memory array that supports sparse piers for three-dimensional memory arrays in accordance with examples as disclosed herein.
Figure 3A:
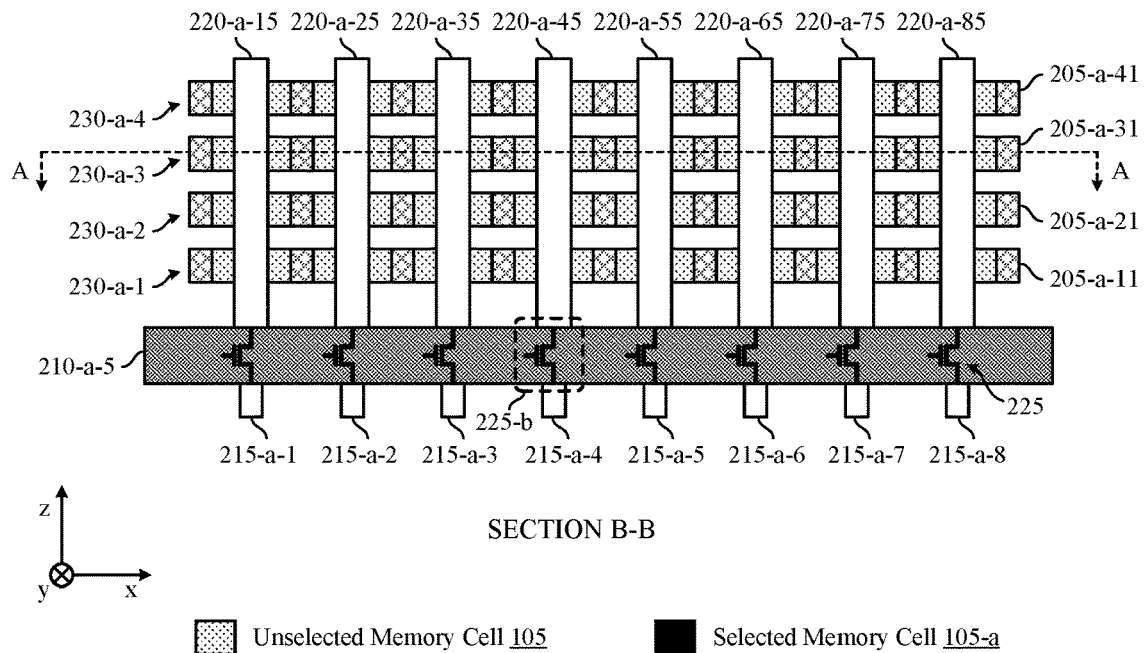
FIGS. 3A and 3B illustrate side views of an example of a memory array that supports sparse piers for three-dimensional memory arrays in accordance with examples as disclosed herein.
Figure 3B:
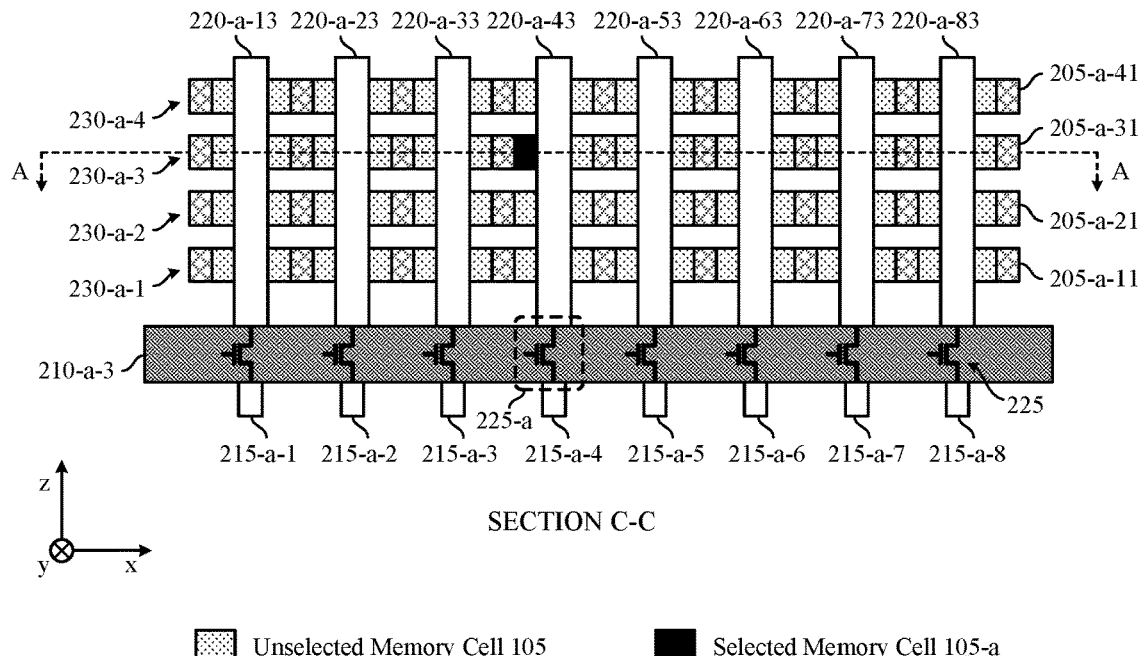

FIGS. 2, 3A, and 3B illustrate an example of a memory array 200 that supports sparse piers for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path, along an end of the pillars 220 opposite from the transistors 225) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{read}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some techniques for manufacturing the memory array 200, voids may be formed between layers of material deposited over a substrate, and other materials may be deposited in the voids (e.g., between the layers of material) to form various circuit structures. For example, voids may be formed between layers of a dielectric material, and word lines 205, memory cells 105, or both may be formed for one or more levels 230 from materials deposited between the layers of the dielectric material. In accordance with examples as disclosed herein, a memory array 200 may include pier structures formed in contact with features formed from alternating layers of materials deposited over a substrate, which may provide mechanical support for subsequent processing. For example, formation of the memory array 200 may include depositing alternating layers of a first material and a second material, which may be formed into interleaved comb structures. Pier structures may be formed in contact with the interleaved comb structures such that, when either the first material or the second material is removed to form voids (e.g., along the z-direction between layers of the comb structures), the pier structures provide mechanical support of the cross-sectional pattern of the remaining material. By implementing such pier structures, the interleaved comb structures, or voids within the interleaved comb structures, may be formed with improved stability or tolerances, such that formation of features between comb structures (e.g., pillars 220), or features between layers of the comb structures (e.g., word lines 205, memory cells 105), or both may be performed with reduced variability or otherwise improved consistency.

FIGS. 4 through 20 illustrate examples of operations that support sparse piers for three-dimensional memory arrays in accordance with examples as disclosed herein. For example, FIGS. 4 through 20 may illustrate aspects of a sequence of operations for fabricating aspects of a material arrangement 400, which may be a portion of a memory device (e.g., a portion of a memory device 100, a portion of a memory array 200, a portion of a memory die). Each view of the figures may be described with reference to an x-direction, a y-direction, and a z-direction, as illustrated, which may correspond to the respective directions described with reference to the memory array 200. Some of the provided figures include section views that illustrate example cross-sections of the material arrangement 400. For example, in FIGS. 4 through 20, a view "SECTION A-A" may be associated with a cross-section in an xz-plane (e.g., in accordance with a cut plane A-A) through a portion of the material arrangement 400 that is associated with a pier, a view "SECTION B-B" may be associated with a cross-section in an xz-plane (e.g., in accordance with a cut plane B-B) through a portion of the material arrangement 400 that is not associated with a pier, a view "SECTION C-C" may be associated with a cross-section in a yz-plane (e.g., in accordance with a cut plane C-C) through a portion of the material arrangement 400 that is associated with a pier, and a view "SECTION D-D" may be associated with a cross-section in an xz-plane (e.g., in accordance with a cut plane D-D) through a portion of the material arrangement 400 that is associated with a conductive pillar (e.g., a pillar 220-*b*). Although the material arrangement 400 illustrates examples of certain relative dimensions and quantities of various features, aspects of the material arrangement 400 may be implemented with other relative dimensions or quantities of such features in accordance with examples as disclosed herein.

Operations illustrated in and described with reference to FIGS. 4 through 20 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 4:
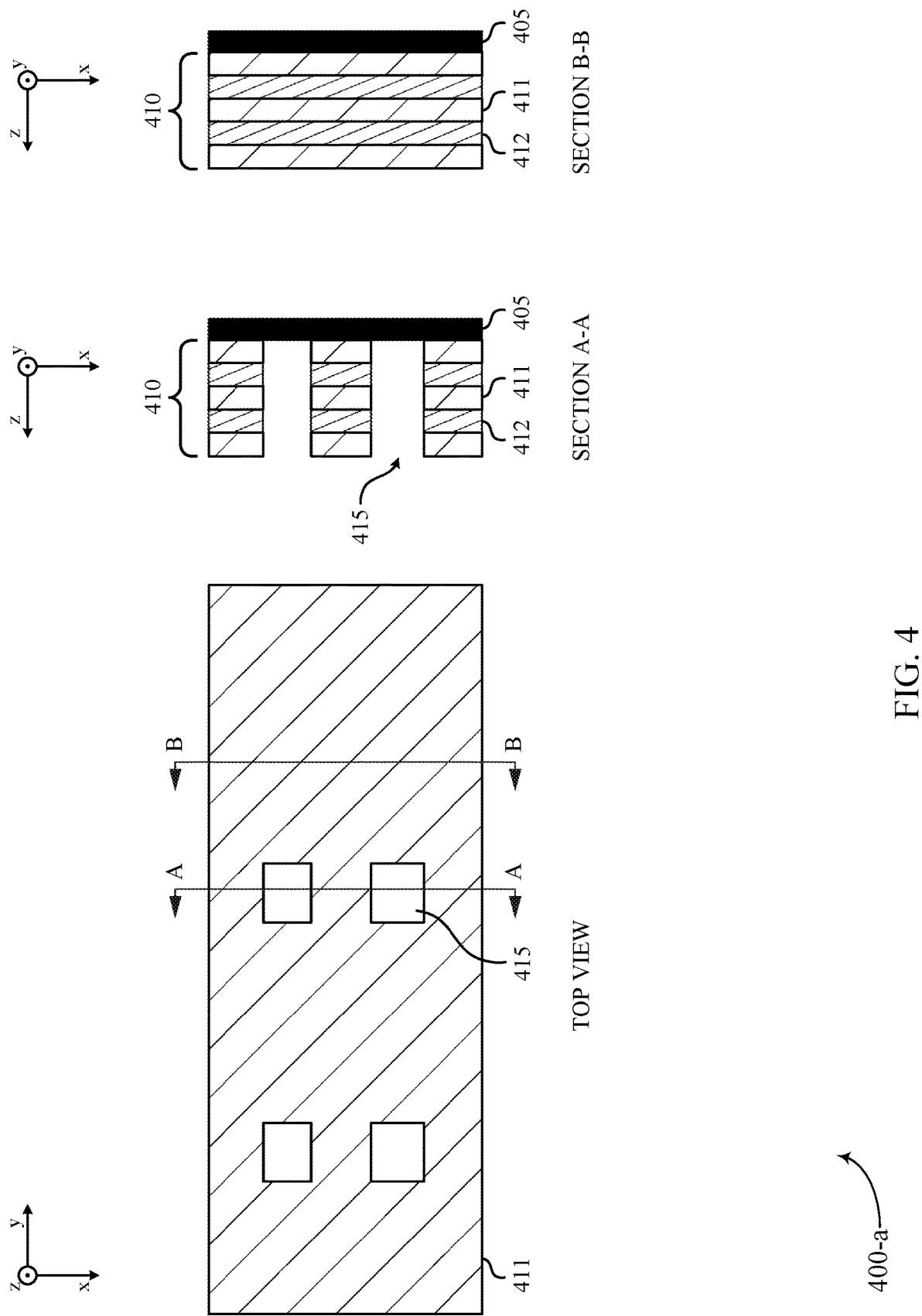

FIG. 4 illustrates a portion 400-*a* of the material arrangement 400 after a first set of one or more manufacturing operations. The first set of manufacturing operations may include depositing a stack of layers 410 over a substrate 405. The substrate 405 may be a semiconductor wafer or other substrate over which the stack of layers 410 is deposited. Although the stack of layers 410 is illustrated as being deposited in direct contact with the substrate 405, in some other examples, the material arrangement 400 may include other materials or components between the stack of layers 410 and the substrate 405, such as interconnection or routing circuitry (e.g., access lines, sense lines 215, gate lines 210), control circuitry (e.g., transistors 225, aspects of a local memory controller 150, decoders, multiplexers), or another stack of layers 410 (e.g., another stack of layers 410 has been processed in accordance with examples as disclosed herein), which may include various conductor, semiconductor, or dielectric materials between the stack of layers 410 and the substrate 405. For example, the material arrangement 400 may include a layer including thin-film-transistors (TFT) between the substrate 405 and the stack of layers 410, such as transistors 225, among others. In some examples, the substrate 405 itself may include such interconnection or routing circuitry.

The stack of layers 410 may include alternating layers of a first material 411 and a second material 412 (e.g., in accordance with alternating material deposition operations). In some examples, the first material 411 may include a dielectric material (e.g., a first dielectric material), such as an oxide (e.g., a tier oxide), and may provide electrical isolation between levels 230. The second material 412 may include various materials that are different than the first material 411, which may support differential processing (e.g., differential etching, high selectivity). For example, the layers of the second material 412 may be sacrificial layers. In some examples, the second material 412 may be a dielectric material, such as a nitride (e.g., a tier nitride). Although the stack of layers 410 is illustrated with five layers (e.g., three layers of the first material 411 and two layers of the second material 412), a stack of layers 410 in accordance with examples as disclosed herein may include any quantity of layers of each of two or more materials (e.g., tens of layers, hundreds of layers, and so on), with either the first material 411 or the second material 412 being relatively closest to the substrate 405.

The first set of manufacturing operations may also include operations (e.g., a pier etch operation) that support forming piers in accordance with examples as disclosed herein. For example, the first set of manufacturing operations may include forming a set of cavities 415 (e.g., first cavities) through the stack of layers 410 (e.g., by removing portions of the first material 411 and the second material 412 along the z-direction to the substrate 405 or to an intervening material between the stack of layers 410 and the substrate 405). The cavities 415, and piers formed therein, may support features having various aspect ratios (e.g., a ratio of depth along the z-direction to width along the x-direction, y-direction, or both), such an aspect ratio of 50:1 or more.

Figure 5:
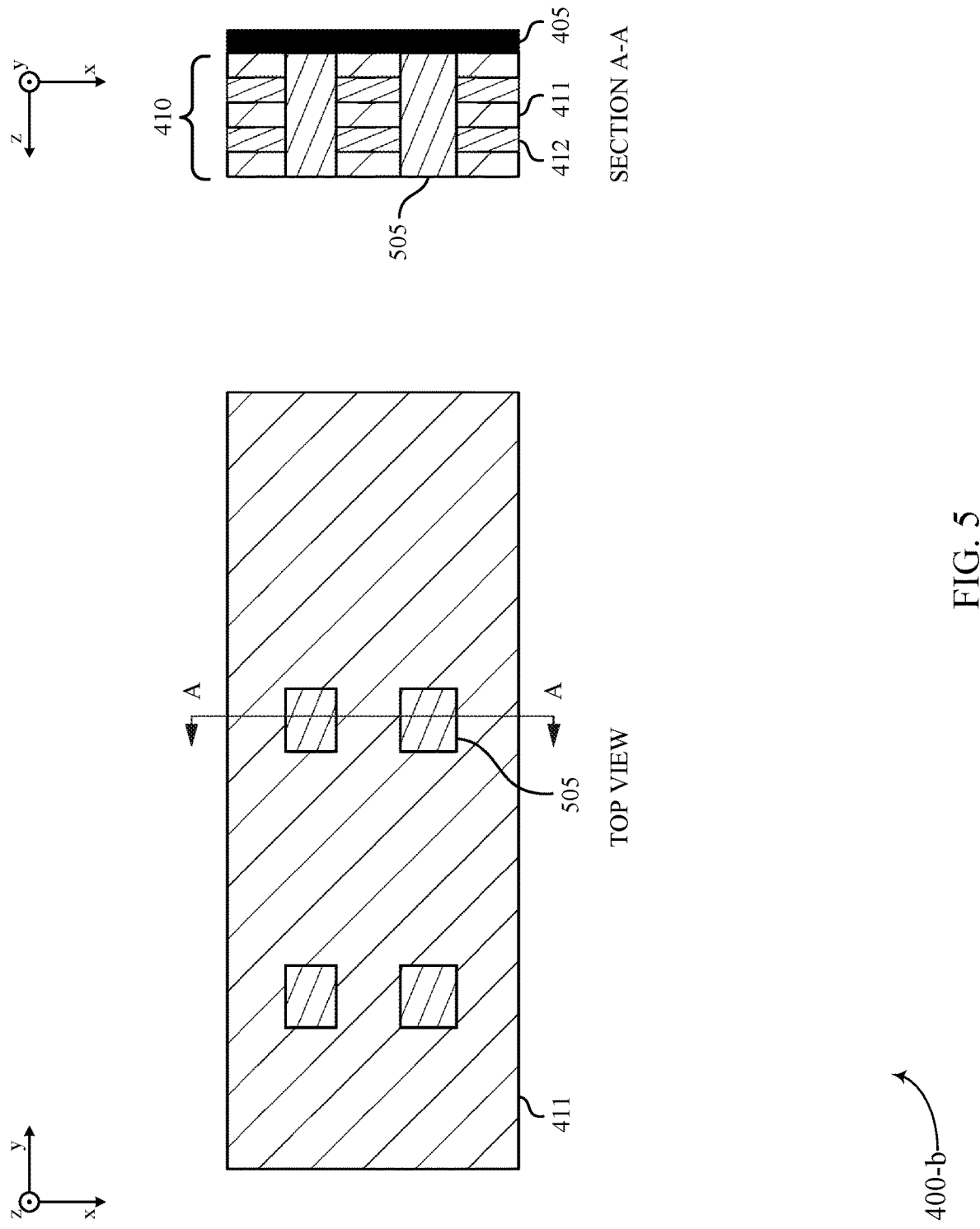

FIG. 5 illustrates a portion 400-b of the material arrangement 400 after a second set of one or more manufacturing operations. The second set of manufacturing operations may include further operations (e.g., a pier fill operation, a pier gap fill operation) that support forming piers in accordance with examples as disclosed herein. For example, the second set of manufacturing operations may include forming a set of piers 505 through the stack of layers 410 by depositing one or more materials (e.g., one or more third materials), such as dielectric material (e.g., a second dielectric material) or a semiconductor (e.g., polysilicon), among other materials, in the cavities 415 (e.g., filling the cavities 415, in contact with the substrate 405). In some examples, the material of the piers 505 may be a dielectric (e.g., an oxide, a pier oxide), which may be the same as or similar to the first material 411. In some examples, the material of the piers 505 may be chosen for having relatively high strength, high stiffness, or bonding strength with the first material 411, the substrate 405, or both. In some examples, the material of the piers 505 may be chosen for having a high selectivity for differential processing relative to the second material 412, such as examples where the second material 412 is removed in subsequent operations. In some examples, the piers 505 may be formed from multiple materials, such as when a pier 505 is formed by first depositing a liner material (e.g., a dielectric liner) in the cavities 415, followed by filling the liner material (e.g., with a material that may be a conductor, a semiconductor, or a dielectric). In some examples, the second set of operations may include a polishing or planarization operation to flatten a top surface of the material arrangement 400, which may support aspects of subsequent operations.

Figure 6:
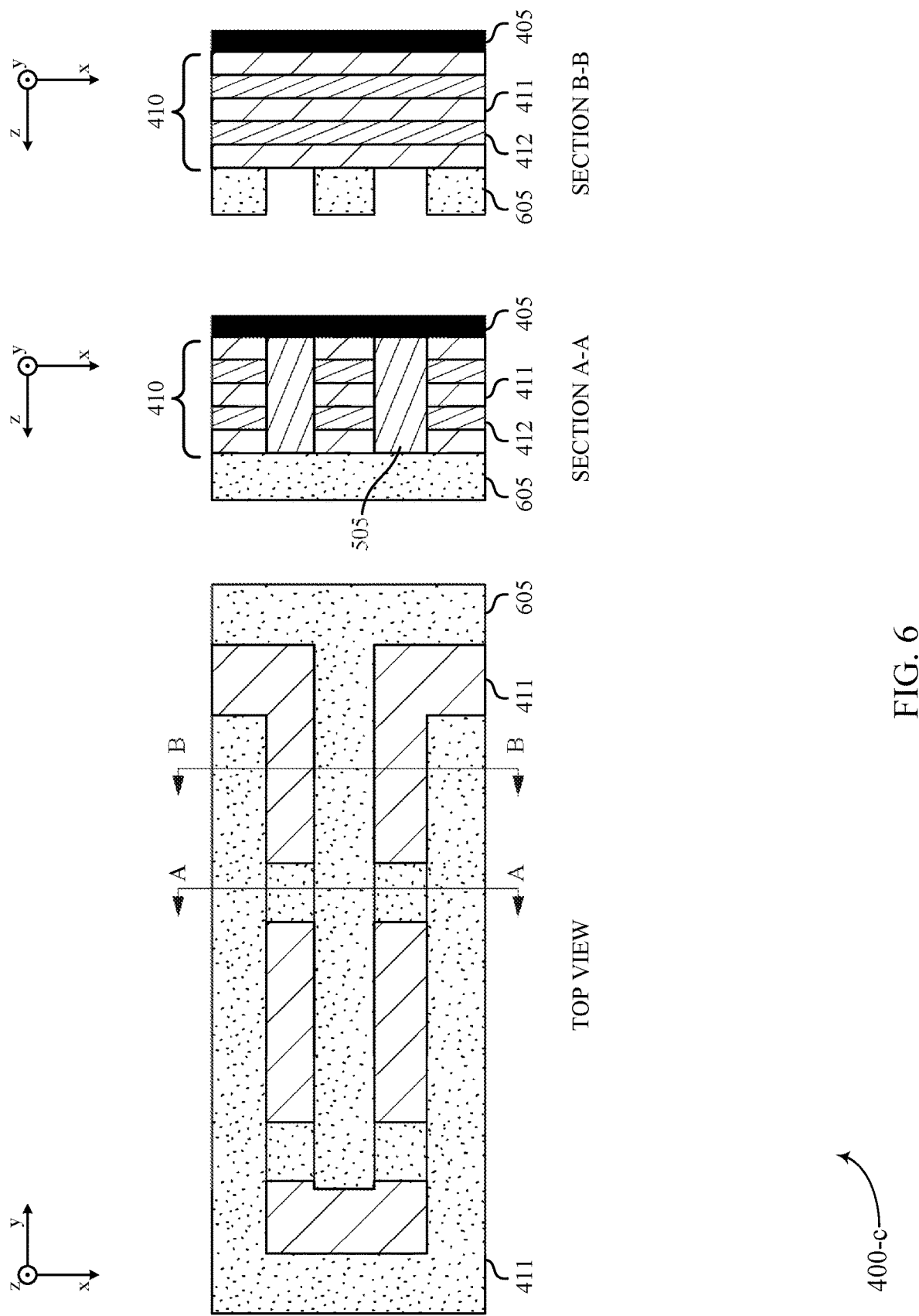

FIG. 6 illustrates a portion 400-c of the material arrangement 400 after a third set of one or more manufacturing operations. The third set of manufacturing operations may include operations (e.g., comb patterning operations) that support forming an interleaved pair of comb structures. For example, the third set of manufacturing operations may include depositing a masking material 605 (e.g., a comb hardmask) over the piers 505 and portions of the stack of layers 410 (e.g., over a top layer of the stack of layers 410, which may be a layer of the first material 411). In some examples, the masking material 605 may be deposited at least partially in a comb pattern (e.g., as viewed in an xy-plane). In some examples, the pattern of the masking material 605 may include a grid over the piers 505 (e.g., masking material 605 covering the piers 505), which may reduce or prevent removal or material from the piers 505.

Figure 7:
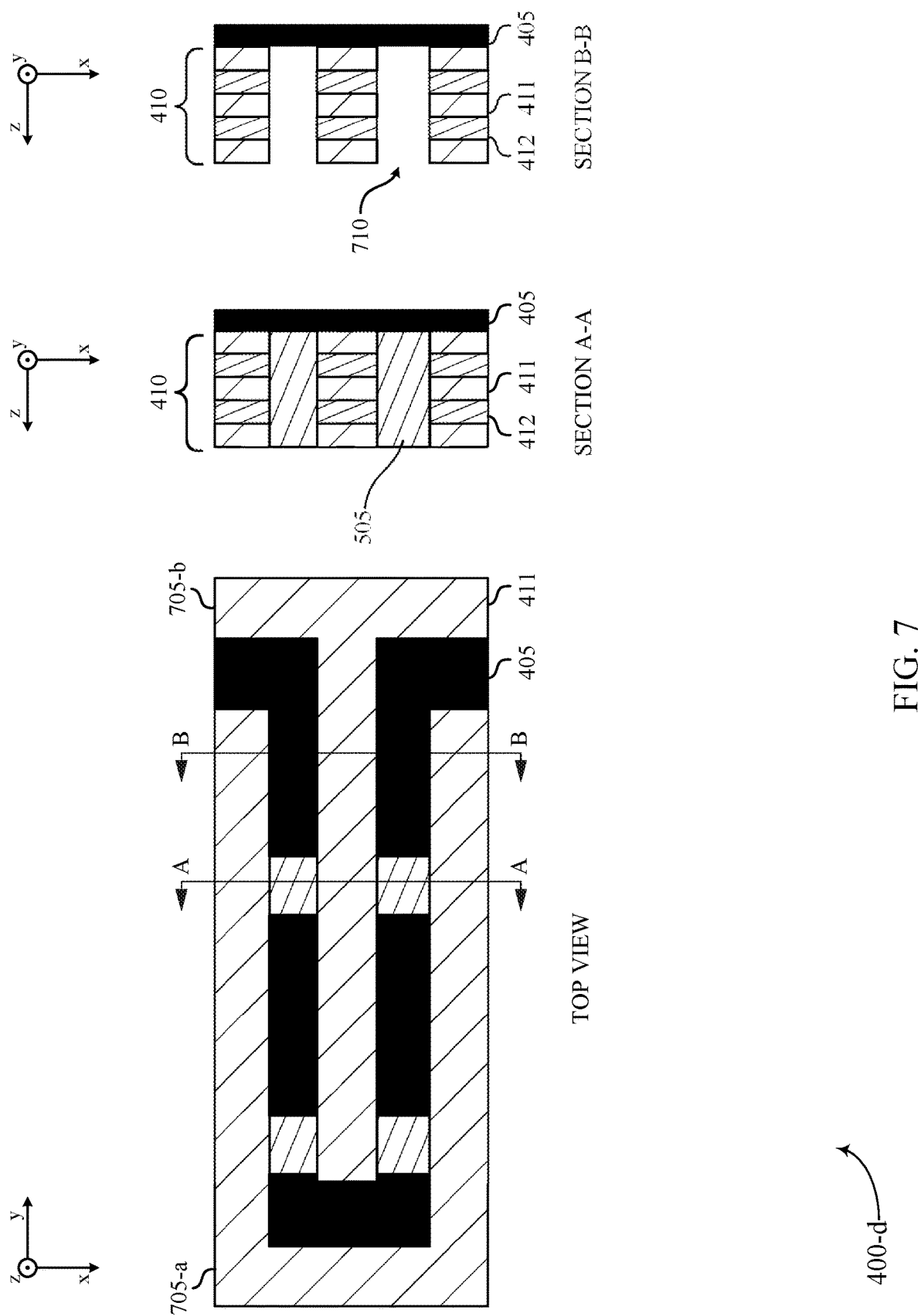

FIG. 7 illustrates a portion 400-d of the material arrangement 400 after a fourth set of one or more manufacturing operations. The fourth set of manufacturing operations may include further operations (e.g., comb etch operations) that support forming an interleaved pair of comb structures. For example, the third set of manufacturing operations may include removing (e.g., etching) portions of the stack of layers 410 between the previously-deposited masking material 605 (e.g., along the z-direction, to the substrate 405 or to an intervening material between the stack of layers 410 and the substrate 405), which may form a set of cavities 710 (e.g., second cavities) along the z-direction. Accordingly, the fourth set of manufacturing operations may illustrate an example for forming an interleaved pair of comb structures 705 (e.g., from the stack of layers 410, of the first material 411 and the second material 412), including a first comb structure 705-a and a second comb structure 705-b, based at least in part on forming the cavities 710 through the stack of layers 410. As illustrated, for both the first comb structure 705-a and the second comb structure 705-b, each of the layers of the first material 411 and each of the layers of the second material 412 may be in contact with one or more of the piers 505 (e.g., each of the piers 505, which may also be in contact with the substrate 405 or other material between the piers 505 and the substrate 405). Thus, by implementing the piers 505 between the comb structures 705-a and 705-b, the comb structures 705-a and 705-b themselves may be formed with improved stability or tolerances, such that downstream formation of features (e.g., between the comb structures 705-a and 705-b, or between layers of either or both of the comb structures 705-a and 705-b) may be performed with reduced variability or otherwise improved consistency. In some examples, the fourth set of manufacturing operations may include removing the previously-deposited masking material 605 (e.g., after forming the cavities 710).

Figure 8:
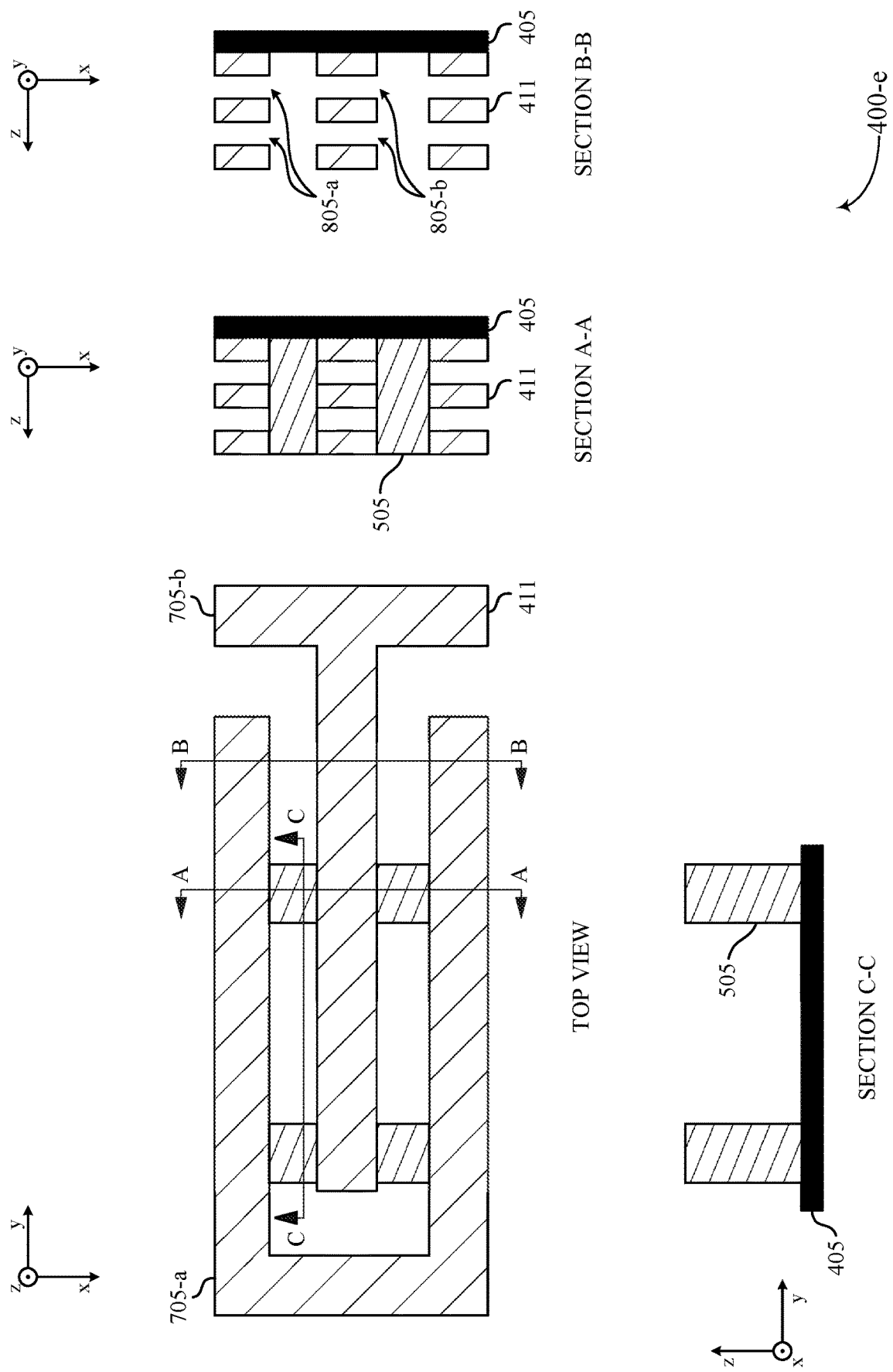

FIG. 8 illustrates a portion 400-e of the material arrangement 400 after a fifth set of one or more manufacturing operations, with the substrate 405 omitted from the top view for illustrative clarity of viewing the cut plane C-C. The fifth set of manufacturing operations may include operations (e.g., exhumation operations, nitride exhumation) that support forming voids in the comb structures 705. For example, the fifth set of operations may include removing (e.g., etching, exhuming) the second material 412 from the first comb structure 705-a and the second comb structure 705-b, which may form a set of first voids 805-*a* between the layers of the first material 411 of the first comb structure 705-*a*, and a set of second voids 805-*b* between the layers of the first material 411 of the second comb structure 705-*b*. The fifth set of operations also may expose sidewalls, or portions thereof, of the piers 505 (e.g., sidewalls in an xz-plane, sidewall portions in a yz-plane between layers of the first material 411).

As illustrated in FIG. 8, the piers 505 may remain in contact with the layers of the first material 411 of the first comb structure 705-*a*, layers of the first material 411 of the second comb structure 705-*b*, and the substrate 405, which may provide mechanical support to the remaining portions of the first comb structure 705-*a* and the second comb structure 705-*b* (e.g., reducing deflection of the remaining layers of the first material 411 along the z-direction, reducing deflection of the remaining layers of the first material 411 along the x-direction, reducing bending of the remaining layers of the first material 411, reducing an unsupported length or cantilever of the remaining layers of the first material 411). Thus, by implementing the piers 505, the voids 805 may be formed with improved stability or tolerances, such that formation of features within the voids 805 (e.g., word lines 205, memory cells 105, between the remaining layers of the first material 411 along the z-direction) may be performed with reduced variability or otherwise improved consistency.

Figure 9:
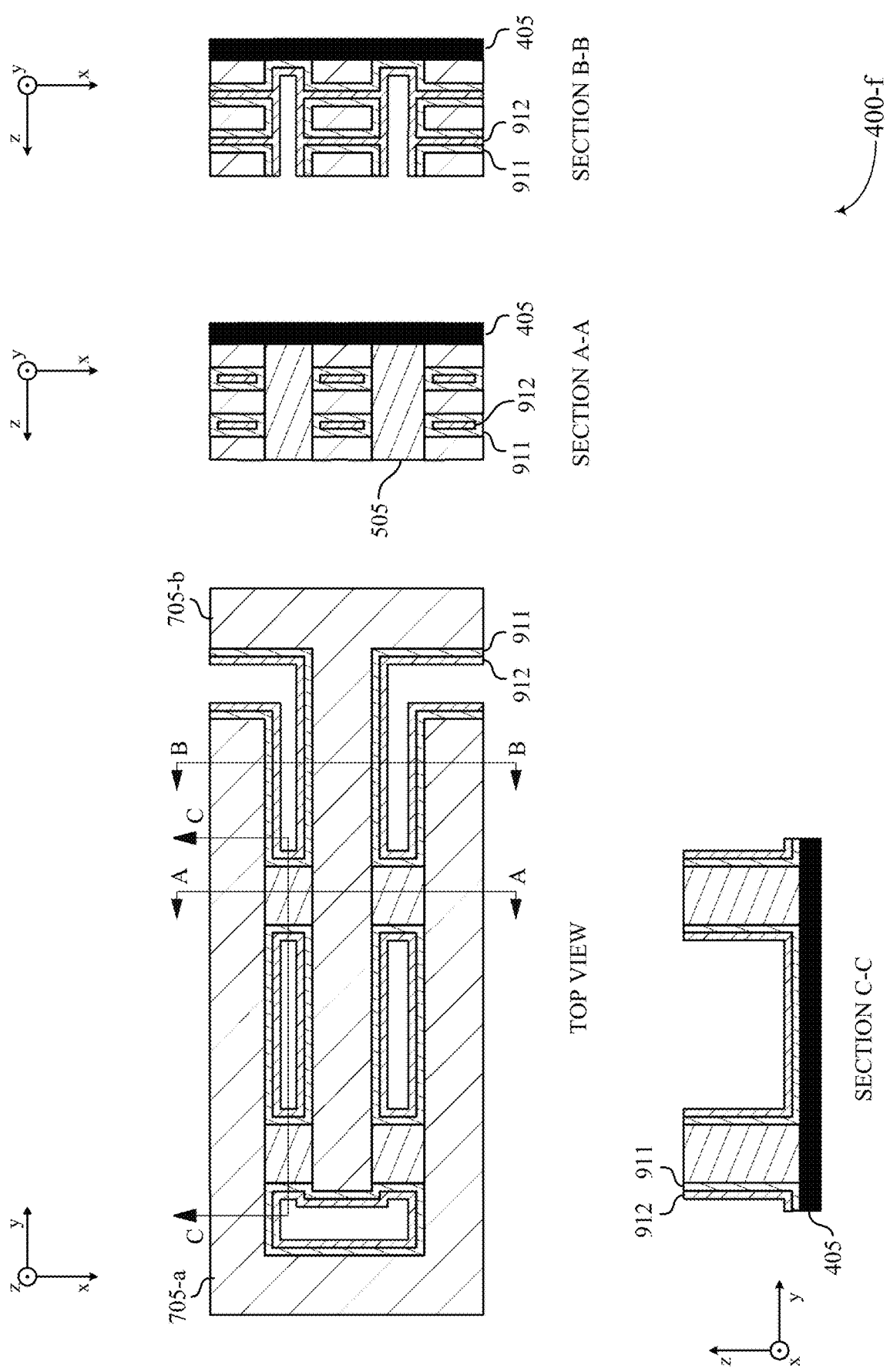

FIG. 9 illustrates a portion 400-*f* of the material arrangement 400 after a sixth set of one or more manufacturing operations. In FIG. 9, the cut plane C-C is omitted for illustrative clarity, but may positioned in a manner as illustrated in FIG. 8. The sixth set of manufacturing operations may include operations (e.g., one or more metal deposition operations) that support forming a plurality of first word lines 205-*b*-n1 and a plurality of second word lines 205-*b*-n2 (e.g., odd and even word lines, respectively, in accordance with n levels 230) based at least in part on depositing one or more conductive materials in the set of first voids 805-*a* and in the set of second voids 805-*b*, respectively. For example, the sixth set of operations may include depositing a first conductive material 911 on exposed surfaces of the material arrangement 400, which may include depositing the first conductive material 911 in contact with the layers of the first material 411 of the first comb structure 705-*a*, in contact with the layers of the first material 411 of the second comb structure 705-*b*, in contact with the substrate 405, and in contact with exposed sidewalls, or portions thereof, of the piers 505. In some examples, the first conductive material 911 may include a barrier material (e.g., a conductive barrier, a liner material, a ceramic material) such as titanium nitride, titanium silicon nitride, tungsten silicon nitride, or others.

In some examples, the sixth set of operations may also include depositing a second conductive material 912 on exposed surfaces of the first conductive material 911, which may include depositing the second conductive material 912 in contact with the first conductive material 911 to fill remaining portions of the set of first voids 805-*a* and remaining portions of the set of second voids 805-*b*. In some examples, the second conductive material 912 may include a metal material, such as tungsten, or a metal alloy. In some examples, the sixth set of operations may include depositing a single conductive material (e.g., omitting a barrier material), such as when the single conductive material is compatible with adjacent materials (e.g., compatible with the substrate 405, compatible with the first material 411, compatible with a material deposited in contact with the single conductive material in a later operation).

Figure 10:
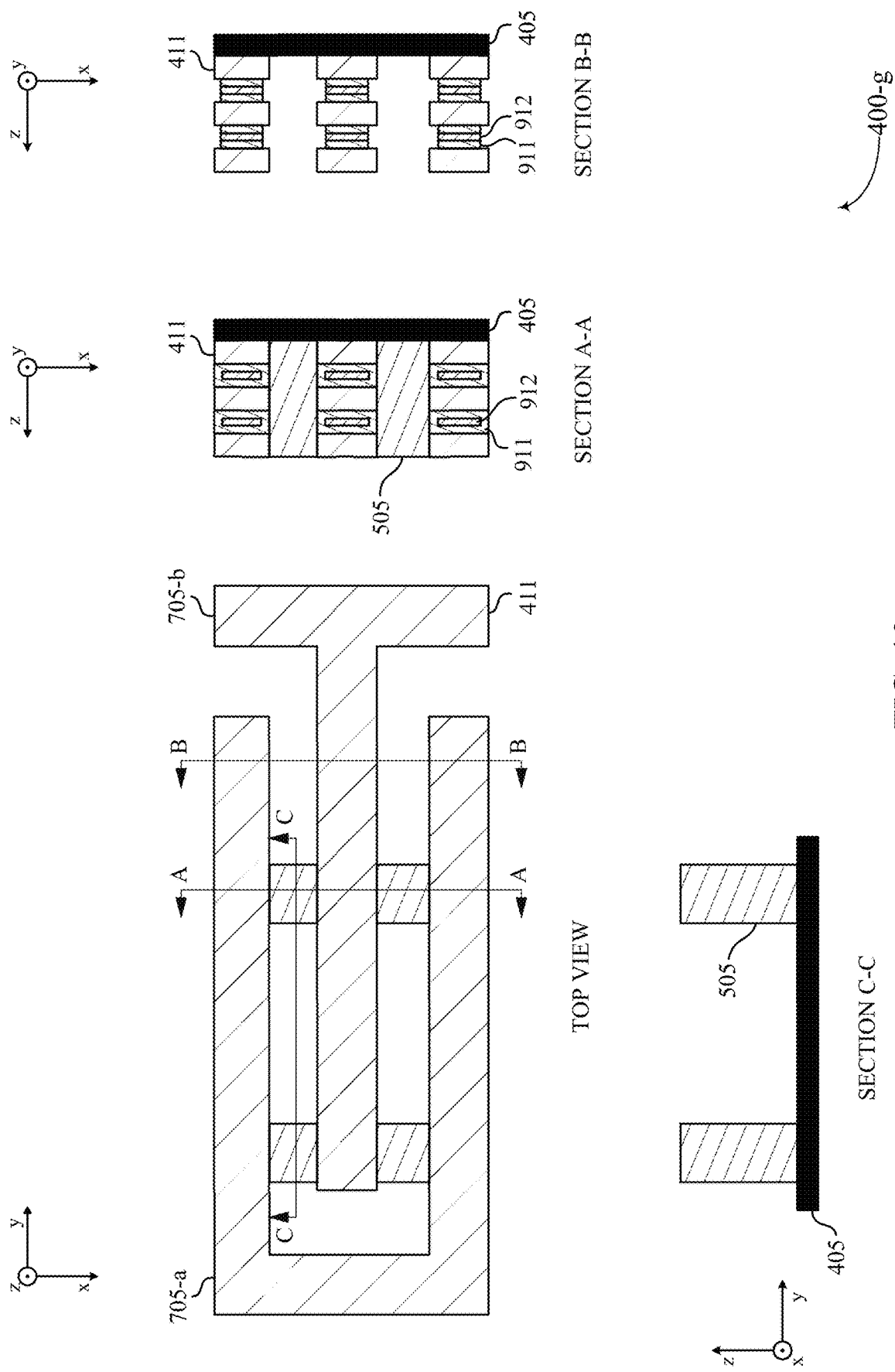

FIG. 10 illustrates a portion 400-*g* of the material arrangement 400 after a seventh set of one or more manufacturing operations. The seventh set of manufacturing operations may include further operations (e.g., a metal recess etch) that support forming the plurality of first word lines 205-*b*-n1 and the plurality of second word lines 205-*b*-n2. For example, the seventh set of operations may include removing (e.g., etching) exposed portions of the first conductive material 911 and the second conductive material 912, which may recess portions of the first conductive material 911 and the second conductive material 912 to be within the voids 805, and which may expose the substrate 405 and at least sidewalls of the first material 411. Such operations may clear the first conductive material 911 and the second conductive material 912 from the cavities 710.

In some examples, an amount of material (e.g., an amount of recess of the first conductive material 911 or of the second conductive material 912) removed along the x-direction at positions along the y-direction between piers 505 (e.g., as illustrated by SECTION B-B) may be greater than an amount of material removed along the x-direction at positions along the y-direction that are coincident with or near piers 505 (e.g., as illustrated by SECTION A-A). For example, as illustrated in SECTION A-A, the first conductive material 911 may remain in contact with the piers 505 (e.g., between layers of the first material 411, where portions of a second conductive material 912 may remain encapsulated and not in contact with the piers 505), whereas, as illustrated in SECTION B-B, sidewalls of the first conductive material 911 and the second conductive material 912 may be within an extent of the first material 411 along the x-direction. In other words, word line conductors (e.g., conductors for word lines 205) may be relatively narrower (e.g., along the x-direction) at positions along the y-direction that are between piers 505 (e.g., farther than a threshold distance along the y-direction from piers 505) and relatively wider at positions along the y-direction that are near piers 505 (e.g., within a threshold distance along the y-direction from piers 505, adjacent or overlapping with piers 505 along the y-direction), including such configurations where a word line conductor remains in contact with piers 505 after completion of the material arrangement 400. Such a difference in material removal, or taper therebetween, may limit an amount of space available for other memory structures (e.g., space in the voids 805 along the x-direction for the formation of memory cells 105) in the vicinity of piers 505. Thus, positions along the y-direction that are within or near an extent of piers 505 along the y-direction may not be suitable for formation of memory cells 105 (e.g., due to inconsistencies along the x-direction relative to other memory cells 105 at different positions along the y-direction). Therefore, memory cells 105 may not be formed in such locations along the y-direction that are near piers 505, or memory cells 105 that may be formed (e.g., partially) in such locations along the y-direction may not be accessed (e.g., may be excluded from a memory cell addressing scheme due to inconsistencies with other memory cells 105).

Figure 11:
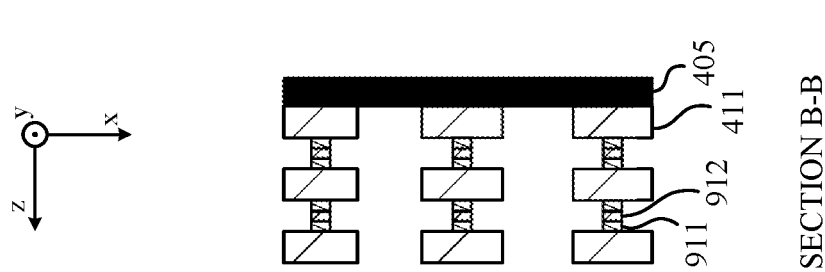

FIG. 11 illustrates a portion 400-*h* of the material arrangement 400 after an eighth set of one or more manufacturing operations, as a cross-sectional side view (e.g., relative to cut plane B-B of FIG. 10). The eighth set of manufacturing operations may include further operations (e.g., a second metal recess etch) that support forming the plurality of first word lines 205-*b*-n1 and the plurality of second word lines 205-*b*-n2. For example, the eighth set of operations may include further removing (e.g., etching) exposed portions of the first conductive material 911 and the second conductive material 912, which may further recess portions of the first conductive material 911 and the second conductive material 912 within the voids 805. In various examples, such further removal may form a gap between the piers 505 and the first conductive material 911 and second conductive material 912 (e.g., exposing sidewall portions of the piers 505 in a yz-plane), or such further removal may not form such a gap. In some examples, the remaining portions of the first conductive material 911 and the second conductive material 912 after the eight set of operations may, at least in part, form the respective word lines 205-b.

Figure 12:
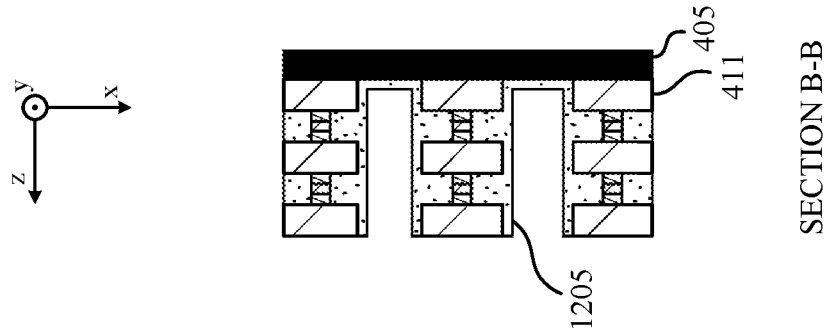

FIG. 12 illustrates a portion 400-i of the material arrangement 400 after a ninth set of one or more manufacturing operations, as a cross-sectional side view (e.g., relative to cut plane B-B of FIG. 10). The ninth set of manufacturing operations may include operations (e.g., a bottom electrode deposition) that support forming electrodes along the word lines 205-b, which may be electrodes between the word lines 205-b and the memory cells 105 of the material arrangement 400. For example, the ninth set of operations may include depositing an electrode material 1205 in contact with exposed portions of the first conductive material 911, the second conductive material 912, the first material 411, the piers 505, and the substrate 405. Accordingly, the material arrangement 400 may include word lines 205-b formed at least in part from a first conductive material 911 and a second conductive material 912, and may, in various examples, include or otherwise be in contact with an electrode material 1205. In some examples, the electrode material 1205 may be a metal or a carbide.

FIG. 13 illustrates a portion 400-j of the material arrangement 400 after a tenth set of one or more manufacturing operations, as a cross-sectional side view (e.g., relative to cut plane B-B of FIG. 10). The tenth set of manufacturing operations may include further operations (e.g., a bottom electrode recess etch operation) that support forming the electrodes along the word lines 205-b. For example, the tenth set of operations may include removing (e.g., etching) exposed portions the electrode material 1205, which may recess portions of the electrode material 1205 to be within the voids 805, and which may expose the substrate 405 and at least sidewalls of the first material 411. Such operations may clear the electrode material 1205 from the cavities 710.

FIG. 14 illustrates a portion 400-k of the material arrangement 400 after an eleventh set of one or more manufacturing operations, as a cross-sectional side view (e.g., relative to cut plane B-B of FIG. 10). The eleventh set of manufacturing operations may include operations that support forming memory cells 105 in the voids 805. For example, the eleventh set of operations may include depositing a material 1405 (e.g., a fourth material) in contact with exposed portions of the electrode material 1205, the first material 411, and the substrate 405. In some examples (e.g., if a material for memory cells 105 is compatible with downstream operations), the material 1405 may be a chalcogenide material, which may support portions of the material 1405 being formed in and operated as respective memory cells 105. In some other examples, the material 1405 may be a placeholder material (e.g., not a chalcogenide or other memory material), in which case at least a portion of the material 1405 may be removed and replaced with a memory material, such as a chalcogenide material, in later operations. In some examples (e.g., due to insufficient material removal operations in the vicinity of a pier 505), an amount of material 1405 in an x-direction at some positions in the y-direction (e.g., positions in the vicinity of a pier 505) may be insufficient for forming memory cells 105.

FIG. 15 illustrates a portion 400-1 of the material arrangement 400 after a twelfth set of one or more manufacturing operations, as a cross-sectional side view (e.g., relative to cut plane B-B of FIG. 10). The twelfth set of manufacturing operations may include further operations (e.g., a recess etch operation) that support forming memory cells 105 in the voids 805. For example, the twelfth set of operations may include removing (e.g., etching) exposed portions the material 1405, which may recess portions of the material 1405 to be within the voids 805, and which may expose the substrate 405 and the sidewalls of the first material 411. In some examples, such operations may clear the material 1405 from the cavities 710.

FIG. 16 illustrates a portion 400-m of the material arrangement 400 after a thirteenth set of one or more manufacturing operations, as a cross-sectional side view (e.g., relative to cut plane B-B of FIG. 10). The thirteenth set of manufacturing operations may include operations (e.g., a gapfill operation) that support forming pillars (e.g., pillars 220-b) in the set of cavities 710. For example, the thirteenth set of operations may include depositing a material 1605 (e.g., a third dielectric material) in the set of cavities 710 (e.g., in contact with exposed surfaces of the cavities 710 and the substrate 405). Thus, the thirteenth set of operations may be an example of depositing the material 1605, after forming the word lines 205-b, between the first comb structure 705-a and the second comb structure 705-b (e.g., between remaining portions of the first material 411 of the comb structures 705 along the x-direction and y-direction) and between the piers 505.

In some examples, the material 1605 may be a same material as the material used for piers 505, or the same material as the first material 411, or both. However, the material 1605 may be distinguishable from the piers 505, or the first material 411, or both, based on an effect of operations downstream of depositing the first material 411 or downstream of forming the piers 505 (e.g., rounding or other erosion of material edges or openings due to etching operations, tapering of features due to etching operations, misalignment or different material removal depths between features), or by identifying material interfaces (e.g., composition boundaries, grain boundaries, formation boundaries, a boundary between piers 505 and material 1605, boundaries along the z-direction) between the material 1605 and the first material 411 or piers 505, or identifying chemical composition differences, among other differences. For example, a cross-sectional area of piers 505 in an xy-plane may be relatively larger at distances nearer to the substrate 405 (e.g., due to taper along the z-direction resulting from an etching operation to form cavities 415), or edges of piers 505 along an x-direction, along a y-direction, or along a z-direction may be rounded or chamfered (e.g., due to material removal operations or other processing during operations after forming piers 505). In some examples, such tapering, rounding, or chamfering may be apparent at an interface between piers 505 and the material 1605, among other interfacing materials deposited after the formation of the piers 505. For example, an interface between piers 505 and material 1605 may have a tapered profile with a positive slope of a surface of pier 505 and a negative slope of material 1605 at the interface.

Figure 17:
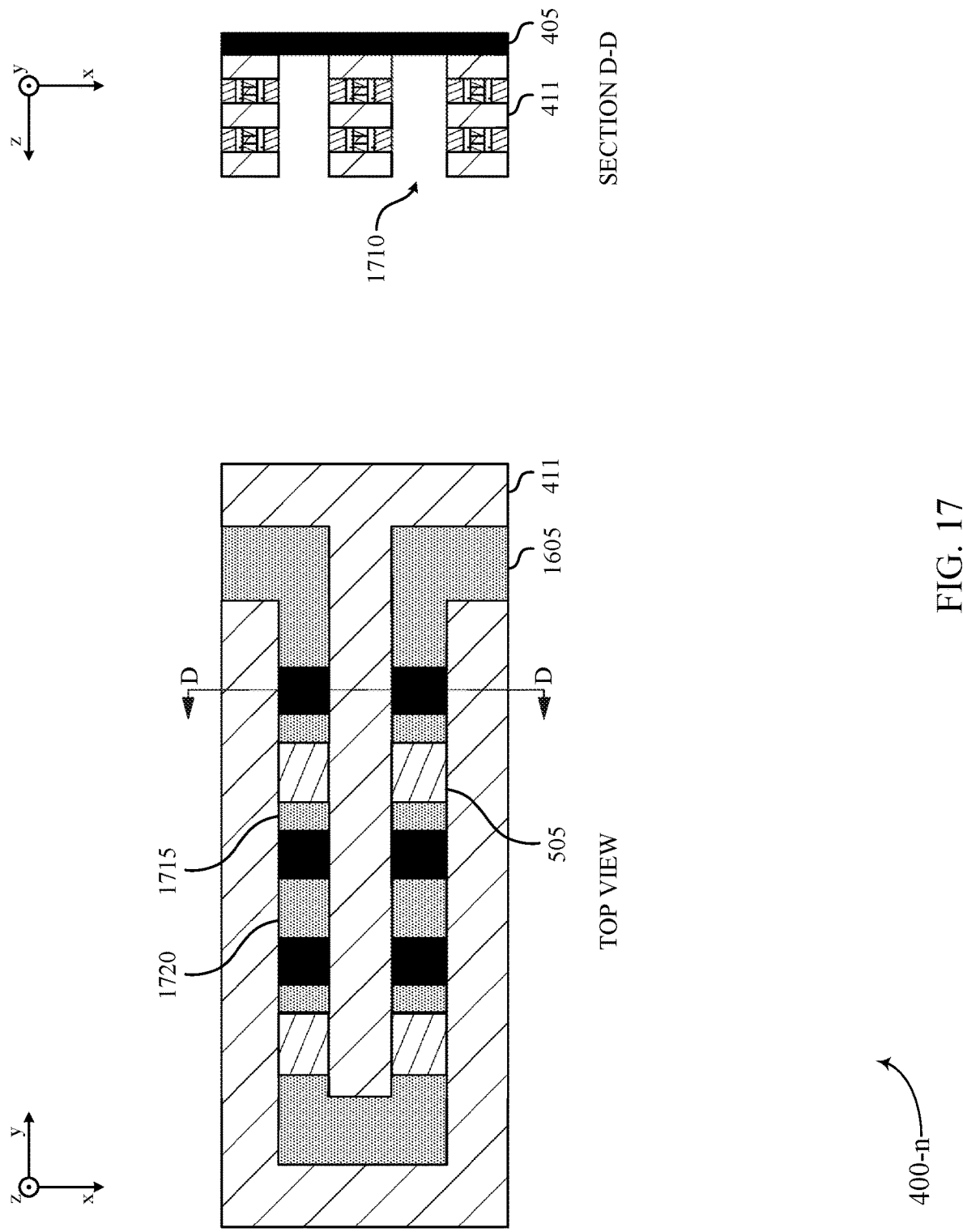

FIG. 17 illustrates a portion 400-n of the material arrangement 400 after a fourteenth set of one or more manufacturing operations. The fourteenth set of manufacturing operations may include further operations (e.g., pillar etch operations)

that support forming pillars in the set of cavities 710. For example, the fourteenth set of manufacturing operations may include removing (e.g., etching) portions of the material 1605 (e.g., exposed through a masking layer, not shown), which may include a removal of the material 1605 along the z-direction (e.g., to the substrate 405 or to an intervening material between the stack of layers 410 and the substrate 405) to form a set of cavities 1710 (e.g., third cavities, formed in respective portions of the cavities 710) through the material 1605. Cavities 1710 may be distributed between the comb structures 705-a and 705-b (e.g., between remaining portions of the first material 411 of the comb structures 705 along the x-direction), including various locations along the y-direction between piers 505 or beyond piers 505 (e.g., beyond piers 505 along a positive or negative y-direction), and may expose at least sidewalls of the material 1405. In some examples, the fourteenth set of manufacturing operations may include removing a masking material associated with the formation of the cavities 1710 (e.g., after forming the cavities 1710).

Although cavities 1710 are illustrated as being separated from piers 505 by at least a portion of the material 1605 (e.g., pier-to-pillar portions 1715), in some other examples, cavities 1710, and any material subsequently deposited therein, may be formed adjacent to, in contact with, or through at least a portion of piers 505 (e.g., where pier-to-pillar portions 1715 may be omitted). Cavities 1710 that are adjacent along the y-direction may be separated by other portions of the material 1605 (e.g., pillar-to-pillar portions 1720, pillar isolation portions). In some examples, pillar-to-pillar portions 1720 may have a same or similar dimension (e.g., along the y-direction) as piers 505. In some such examples (e.g., where pier-to-pillar portions 1715 are omitted), cavities 1710, and piers 505 formed therein, may have a consistent pitch along the y-direction across locations of the material arrangement 400 that are associated with piers 505.

FIG. 18 illustrates a portion 400-o of the material arrangement 400 after an fifteenth set of one or more manufacturing operations, as a cross-sectional side view (e.g., relative to cut plane D-D of FIG. 17). The fifteenth set of manufacturing operations may include further operations (e.g., top electrode deposition operations) that support forming pillars in the set of cavities 710 (e.g., as a deposition of one or more conductive materials in the cavities 1710), which may be associated with an electrode along an outer surface of a pillar. For example, the fifteenth set of operations may include depositing an electrode material 1805 on exposed surfaces of the cavities 1710, which may include depositing the electrode material 1805 in contact with the layers of the first material 411 of the first comb structure 705-a, in contact with the layers of the first material 411 of the second comb structure 705-b, in contact with exposed surfaces of the material 1405, and in contact with the substrate 405. In some examples, the electrode material 1805 may be a metal or a carbide. In some examples, the electrode material 1805 may be the same as the electrode material 1205.

FIG. 19 illustrates a portion 400-p of the material arrangement 400 after a sixteenth set of one or more manufacturing operations, as a cross-sectional side view (e.g., relative to cut plane D-D of FIG. 17). The sixteenth set of manufacturing operations may include further operations that support forming an electrode along an outer surface of a pillar. For example, the sixteenth set of operations may include removing (e.g., etching) portions the electrode material 1805 at the bottom of the cavities 1710, which may expose the substrate 405. In some examples, the sixteenth set of operations may be omitted.

Figure 20:
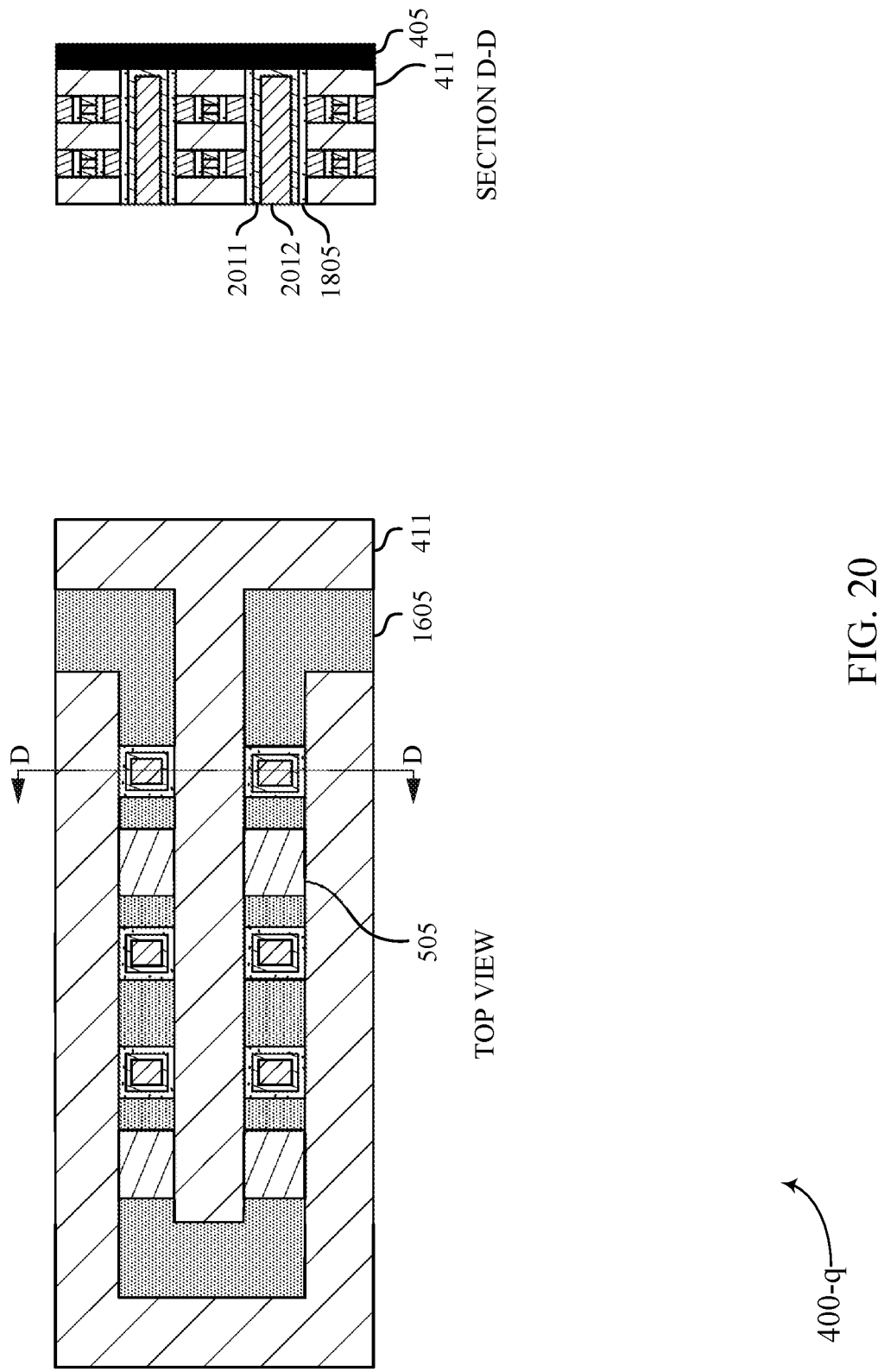

FIG. 20 illustrates a portion 400-q of the material arrangement 400 after a seventeenth set of one or more manufacturing operations. The seventeenth set of manufacturing operations may include further operations (e.g., one or more metal deposition operations) that support forming pillars in the set of cavities 710 (e.g., in the cavities 1710). For example, the seventeenth set of operations may include depositing a third conductive material 2011 on exposed surfaces of the electrode material 1805 (e.g., and the substrate 405, when exposed). In some examples, the third conductive material 2011 may be the same as the first conductive material 911. For example, the third conductive material 2011 may include a barrier material (e.g., a conductive barrier, a liner material, a ceramic material) such as titanium nitride titanium silicon nitride, tungsten silicon nitride, or others. In some examples, the seventeenth set of operations may also include depositing a fourth conductive material 2012 on exposed surfaces of the third conductive material 2011, which may include depositing the fourth conductive material 2012 in contact with the third conductive material 2011 to fill remaining portions of the cavities 1710. In some examples, the fourth conductive material 2012 may be the same as the second conductive material 912. For example, the fourth conductive material 2012 may include a metal material, such as tungsten, or a metal alloy. Accordingly, the material arrangement 400 may include pillars (e.g., pillars 220-b) formed at least in part from a third conductive material 2011 and a fourth conductive material 2012, and may, in various examples, include or otherwise be in contact with an electrode material 1805. In some examples, the seventeenth set of operations may include depositing a single conductive material (e.g., omitting a barrier material), such as when the single conductive material is compatible with adjacent materials (e.g., compatible with the substrate 405, compatible with the electrode material 1805, compatible with a material deposited in contact with the single conductive material in a later operation).

In some examples (e.g., when a material 1405 comprises a memory material, such as a chalcogenide), the material arrangement 400 may be suitable for implementation in a memory array after the seventeenth set of operations. In some other examples (e.g., when the material 1405 is a placeholder material), further operations may be performed to form memory cells in the material arrangement 400.

FIGS. 21 through 24 illustrate a first example for forming memory cells (e.g., memory cells 105) in a material arrangement (e.g., material arrangement 400) that supports sparse piers for three-dimensional memory arrays in accordance with examples as disclosed herein. For example, FIGS. 21 through 24 may illustrate aspects of a sequence of operations for fabricating aspects of a material arrangement 2100, which may be a portion of a memory device (e.g., a portion of a memory device 100, a portion of a memory array 200, a portion of a memory die). Each of the figures may be described with reference to an x-direction, a y-direction, and a z-direction, as illustrated, which may correspond to the respective directions described with reference to the memory array 200. Each of the figures provide section views that illustrate example cross-sections of the material arrangement 2100, in an xy-plane, at a position along the z-direction (e.g., a level 230) that is associated with word lines 205 and memory cells 105. Although the material arrangement 2100 illustrates examples of certain relative dimensions and quantities of various features, aspects of the material arrangement 2100 may be implemented with other relative dimensions or quantities of such features in accordance with examples as disclosed herein.

Operations illustrated in and described with reference to FIGS. 21 through 24 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein. In some examples, the operations of FIGS. 21 through 24 may be performed at least in part after the seventeenth set of operations described with reference to FIG. 20.

The material arrangement 2100 may include word lines 205-c-n1 and 205-c-n2 (e.g., an odd and even word line, respectively) and pillars 220-c, which may be examples of the respective features as described with reference to FIGS. 2 through 20. In some examples, the word lines 205-c may include one or more of an electrode portion 2105 (e.g., a bottom electrode, an electrode material 1205), a first conductor portion 2110 (e.g., a first conductive material 911), and a second conductor portion 2115 (e.g., a second conductive material 912). In some examples, the pillars 220-c may include one or more of an electrode material (e.g., an electrode material 1805), a first conductor portion (e.g., a first conductive material 2011), and a second conductor portion (e.g., a second conductive material 2012), not shown.

FIG. 21 illustrates a portion of the material arrangement 2100 after a first set of one or more manufacturing operations. The first set of manufacturing operations may include operations (e.g., a separator etch operation) that form material portions 2120 between the pillars 220-c and the word lines 205-c. In some examples, the material portions 2120 may be portions of a material 1405 (e.g., a placeholder material) that remain after an etching or other material removal operation of the first set of operations. For example, material removal of the first set of operations may provide access along the z-direction (e.g., along each gap between pillars 220-d), from a top surface of a material arrangement 400 to areas between comb structures 705, and to voids 805, for subsequent operations such as etching and deposition operations. In some examples, the first set of operations may include removing portions of a material 1605 (e.g., pillar-to-pillar portions 1720), or material of piers 505, or both from between the pillars 220-c. In some examples, the first set of operations may be supported by depositing a masking material over each of the pillars 220-c (e.g., on a same pitch as the pillars 220-c), which may extend across the material arrangement 2100 between pillars 220-c along the x-direction (e.g., across rows of pillars 220-c along on a top surface of a material arrangement 400) and performing a material removal operation between pillars 220-c that proceeds favorably along the z-direction. In some examples, the first set of operations may be supported with a directional material removal operation between pillars 220-c that does not rely on a masking layer.

FIG. 22 illustrates a portion of the material arrangement 2100 after a second set of one or more manufacturing operations. The second set of manufacturing operations may include operations (e.g., a placeholder recess operation) to remove the material portions 2120 from between the pillars 220-c and the word lines 205-c. In some examples, the second set of operations may include a non-directional etching operation (e.g., as supported by the access along the z-direction as provided by the first set of operations), which may clear the material portions 2120 (e.g., a material 1405) from between the pillars 220-c and the word lines 205-c. In various examples, the first set of operations, or a combination of the first set of operations and the second set of operations, may be an example of removing a material 1405 from voids 805 between layers of a first material 411 of comb structures 705.

FIG. 23 illustrates a portion of the material arrangement 2100 after a third set of one or more manufacturing operations. The third set of manufacturing operations may include operations (e.g., a cell deposition operation) that support forming memory cells 105 in the material arrangement 2100. For example, the third set of manufacturing operations may include depositing the memory material 2305 on exposed surfaces of the material arrangement 2100, which may include depositing the memory material in contact with the word lines 205-c, the pillars 220-c, and other structures along the z-direction (e.g., exposed surfaces of layers of a first material 411 of comb structures 705). The third set of manufacturing operations may be an example of depositing the memory material 2305 at least in voids 805 between layers of the first material 411 of comb structures 705, such that the memory material 2305 is coupled between (e.g., in contact with) the pillars 220-c and the word lines 205-c.

FIG. 24 illustrates a portion of the material arrangement 2100 after a fourth set of one or more manufacturing operations. The fourth set of manufacturing operations may include further operations (e.g., a cell recess operation) that support forming memory cells 105 in the material arrangement 2100. For example, the fourth set of manufacturing operations may include removing (e.g., etching) exposed portions of the memory material 2305, which may recess portions of the memory material 2305 to form discrete memory cells 105-c, each between a respective one of the pillars 220-c and one of the word lines 205-c. In some examples, the fourth set of manufacturing operations may employ a directional material removal operation (e.g., along the z-direction), which may be similar to aspects of a material removal operation of the first set of manufacturing operations. In some examples, the fourth set of manufacturing operations may be followed by a gap fill operation, which may include filling at least some of the remaining cavities or voids of the material arrangement 2100 with at least a dielectric material (not shown).

FIGS. 25 through 28 illustrate a second example for forming memory cells (e.g., memory cells 105) in a material arrangement (e.g., material arrangement 400) that supports sparse piers for three-dimensional memory arrays in accordance with examples as disclosed herein. For example, FIGS. 25 through 28 may illustrate aspects of a sequence of operations for fabricating aspects of a material arrangement 2500, which may be a portion of a memory device (e.g., a portion of a memory device 100, a portion of a memory array 200, a portion of a memory die). Each of the figures may be described with reference to an x-direction, a y-direction, and a z-direction, as illustrated, which may correspond to the respective directions described with reference to the memory array 200. Each of the figures provide section views that illustrate example cross-sections of the material arrangement 2500, in an xy-plane, at a position along the z-direction that is associated with word lines 205 and memory cells 105. Although the material arrangement 2500 illustrates examples of certain relative dimensions and quantities of various features, aspects of the material arrangement 2500 may be implemented with other relative dimensions or quantities of such features in accordance with examples as disclosed herein.

Operations illustrated in and described with reference to FIGS. 25 through 28 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein. In some examples, the operations of FIGS. 25 through 28 may be performed at least in part after the seventeenth set of operations described with reference to FIG. 20.

The material arrangement 2500 may include word lines 205-d-n1 and 205-d-n2 (e.g., an odd and even word line, respectively) and pillars 220-d, which may be examples of the respective features as described with reference to FIGS. 2 through 20. In some examples, the word lines 205-d may include one or more of an electrode portion 2505 (e.g., a bottom electrode, an electrode material 1205), a first conductor portion 2510 (e.g., a first conductive material 911), and a second conductor portion 2515 (e.g., a second conductive material 912). In some examples, the pillars 220-d may include one or more of an electrode material (e.g., an electrode material 1805), a first conductor portion (e.g., a first conductive material 2011), and a second conductor portion (e.g., a second conductive material 2012), not shown.

Figure 25:
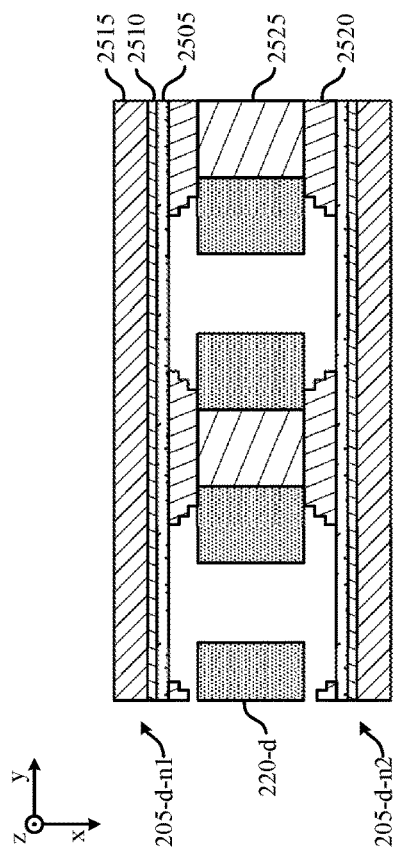
FIGS. 25 through 28 illustrate a second example for forming memory cells in a material arrangement that supports sparse piers for three-dimensional memory arrays in accordance with examples as disclosed herein.

FIG. 25 illustrates a portion of the material arrangement 2500 after a first set of one or more manufacturing operations. The first set of manufacturing operations may include operations (e.g., a separator etch operation) that form material portions 2520 between the pillars 220-d and the word lines 205-d. In some examples, the material portions 2520 may be portions of a material 1405 (e.g., a placeholder material) that remain after an etching or other material removal operation of the first set of operations. For example, material removal of the first set of operations may provide access along the z-direction (e.g., along every other gap between pillars 220-d), from a top surface of a material arrangement 400 to areas between comb structures 705, and to voids 805, for subsequent operations such as etching and deposition operations. In some examples, the first set of operations may include removing portions of a material 1605 (e.g., pillar-to-pillar portions 1720), or material of piers 505, or both from between pairs of the pillars 220-d, whereas material portions 2525 (e.g., other portions of the material 1605 or piers 505 that are not removed) may remain between pillars 220-d of each pair. In some examples, the first set of operations may be supported by depositing a masking material over each of the pillars 220-d and between pairs of pillars 220-d (e.g., over material portions 2525, at twice the pitch as the pillars 220-d), which may extend across the material arrangement 2500 between pillars 220-d along the x-direction (e.g., across rows of pillars 220-d along on a top surface of a material arrangement 400) and performing a material removal operation between pairs of pillars 220-d that proceeds favorably along the z-direction. In some examples, such an operation may be supported with a directional material removal operation between pairs of pillars 220-d that does not rely on a masking layer.

Figure 26:
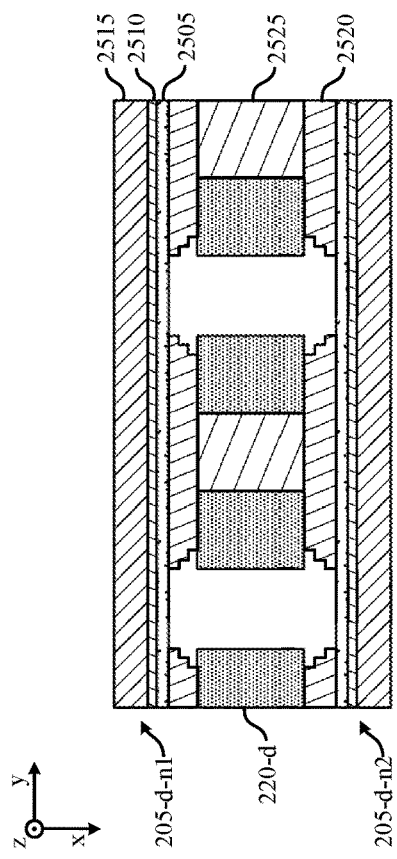

FIG. 26 illustrates a portion of the material arrangement 2500 after a second set of one or more manufacturing operations. The second set of manufacturing operations may include operations (e.g., a placeholder recess operation) to recess edges of the material portions 2520 between the pillars 220-d and the word lines 205-d (e.g., along the y-direction), but not to remove material portions 2520 entirely. In some examples, the second set of operations may include a non-directional etching operation (e.g., as supported by the access along the z-direction as provided by the first set of operations). In various examples, the first set of operations, or a combination of the first set of operations and the second set of operations, may be an example of removing a portion of a material 1405 from voids 805 between layers of a first material 411 of comb structures 705, while at least some of the material 1405 may remain in contact with a word line 205-d and each pillar 220-d. Moreover, in some examples, the material portions 2525 may remain encapsulated between pillars 220-d and material portions 2520 (e.g., within a level 230 illustrated by the section view of FIG. 26.

Figure 27:
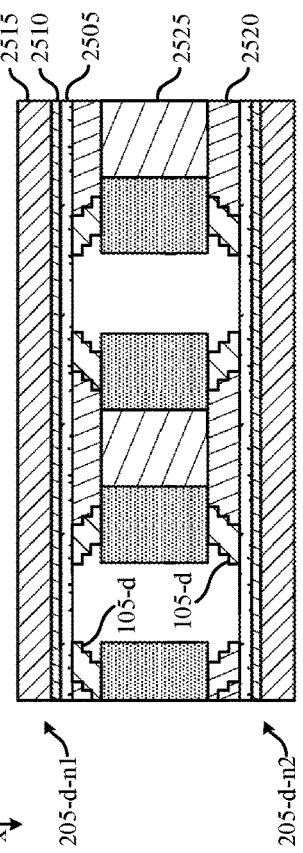

FIG. 27 illustrates a portion of the material arrangement 2500 after a third set of one or more manufacturing operations. The third set of manufacturing operations may include operations (e.g., a cell deposition operation) that support forming memory cells 105 in the material arrangement 2500. For example, the third set of manufacturing operations may include depositing the memory material 2705 on exposed surfaces of the material arrangement 2100, which may include depositing the memory material in contact with the word lines 205-c, the pillars 220-c, the material portions 2520, and other structures along the z-direction (e.g., exposed surfaces of layers of a first material 411 of comb structures 705). The third set of manufacturing operations may be an example of depositing the memory material 2705 at least in voids 805 between layers of the first material 411 of comb structures 705, such that the memory material 2305 is coupled between (e.g., in contact with) the pillars 220-d and the word lines 205-d, and is in contact with the material portions 2520.

Figure 28:
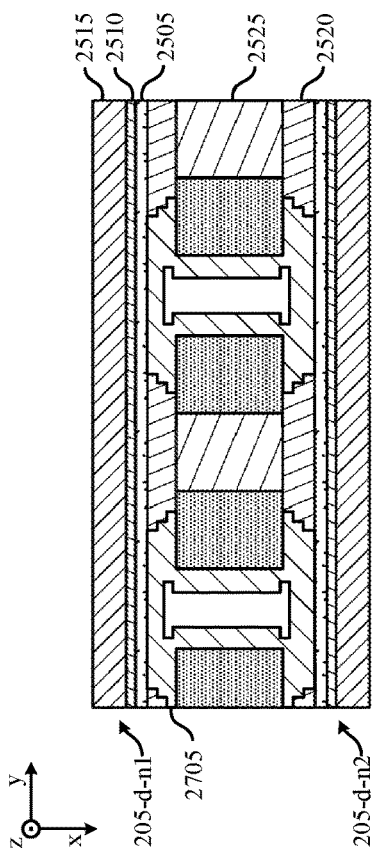

FIG. 28 illustrates a portion of the material arrangement 2500 after a fourth set of one or more manufacturing operations. The fourth set of manufacturing operations may include further operations (e.g., a cell recess operation) that support forming memory cells 105 in the material arrangement 2100. For example, the fourth set of manufacturing operations may include removing (e.g., etching) exposed portions of the memory material 2705, which may recess portions of the memory material 2705 to form discrete memory cells 105-d, each between a respective one of the pillars 220-d and one of the word lines 205-d. In some examples, the fourth set of manufacturing operations may employ a directional material removal operation (e.g., along the z-direction), which may be similar to aspects of a material removal operation of the first set of manufacturing operations. In some examples, the fourth set of manufacturing operations may be followed by a gap fill operation, which may include filling at least some of the remaining cavities or voids of the material arrangement 2500 with at least a dielectric material (not shown).

FIGS. 29A and 29B illustrate examples of layouts 2901 and 2902, respectively, that support sparse piers for three-dimensional memory arrays in accordance with examples as disclosed herein. Each of the layouts 2901 and 2902 may illustrate examples of portions of a material arrangement as disclosed herein (e.g., a material arrangement 400). For example, each of the layouts 2901 and 2902 may illustrate a respective arrangement of word lines 205, piers 505, and pillar-to-pillar portions 1720. Other aspects of a material arrangement, such as pillars 220 and memory cells 105 (e.g., which may be located between the word lines 205, piers 505, and pillar-to-pillar portions 1720), are omitted for illustrative clarity.

Layout 2901 illustrates an example of a first density of piers 505 (e.g., with piers 505-*a* separated by a relatively large quantity of cell pitches along the y-direction). For example, layout 2901 may include two rows of piers 505-*a*, arranged at (e.g., aligned with) different positions along the y-direction, which may include piers 505-*a*-1 and 505-*a*-2, respectively. With a relatively lower density of piers 505-*a* (e.g., along the y-direction), the layout 2901 may have relatively lower structural integrity (e.g., during formation operations associated with the layout 2901). However, the layout 2901 may have a relatively higher array density (e.g., a higher quantity of operational memory cells 105 for a given footprint in an xy-plane), because fewer portions of the layout 2901 (e.g., fewer portions in a vicinity of a pier 505-*a*) may be adversely affected regarding memory cell formation (e.g., as described with reference to FIGS. 10 and 14).

Layout 2902 illustrates an example of a second density of piers 505 (e.g., with piers 505-*b* located at every six cell pitches along the y-direction). For example, layout 2902 may include eight rows of piers 505-*b*, arranged at different positions along the y-direction, which may include piers 505-*b*-1 through 505-*b*-8, respectively. With a relatively higher density of piers 505-*b*, the layout 2902 may have relatively greater structural integrity (e.g., during formation operations associated with the layout 2902). However, the layout 2902 may have a relatively lower array density (e.g., a lower quantity of operational memory cells 105 for a given footprint in an xy-plane), because more portions of the layout 2902 (e.g., more portions in a vicinity of a pier 505-*b*) may be adversely affected regarding memory cell formation (e.g., as described with reference to FIGS. 10 and 14).

Thus, the layouts 2901 and 2902 illustrate how a density of piers 505 may be associated with a tradeoff between structural integrity and array density. In some examples, a density of piers 505, and other related features, may be associated with other tradeoffs or considerations, such as relative sizes of features, different materials of features, different operations for features, quantities of features associated with decoding or multiplexing grouping, among other tradeoffs or considerations.

Figure 30:
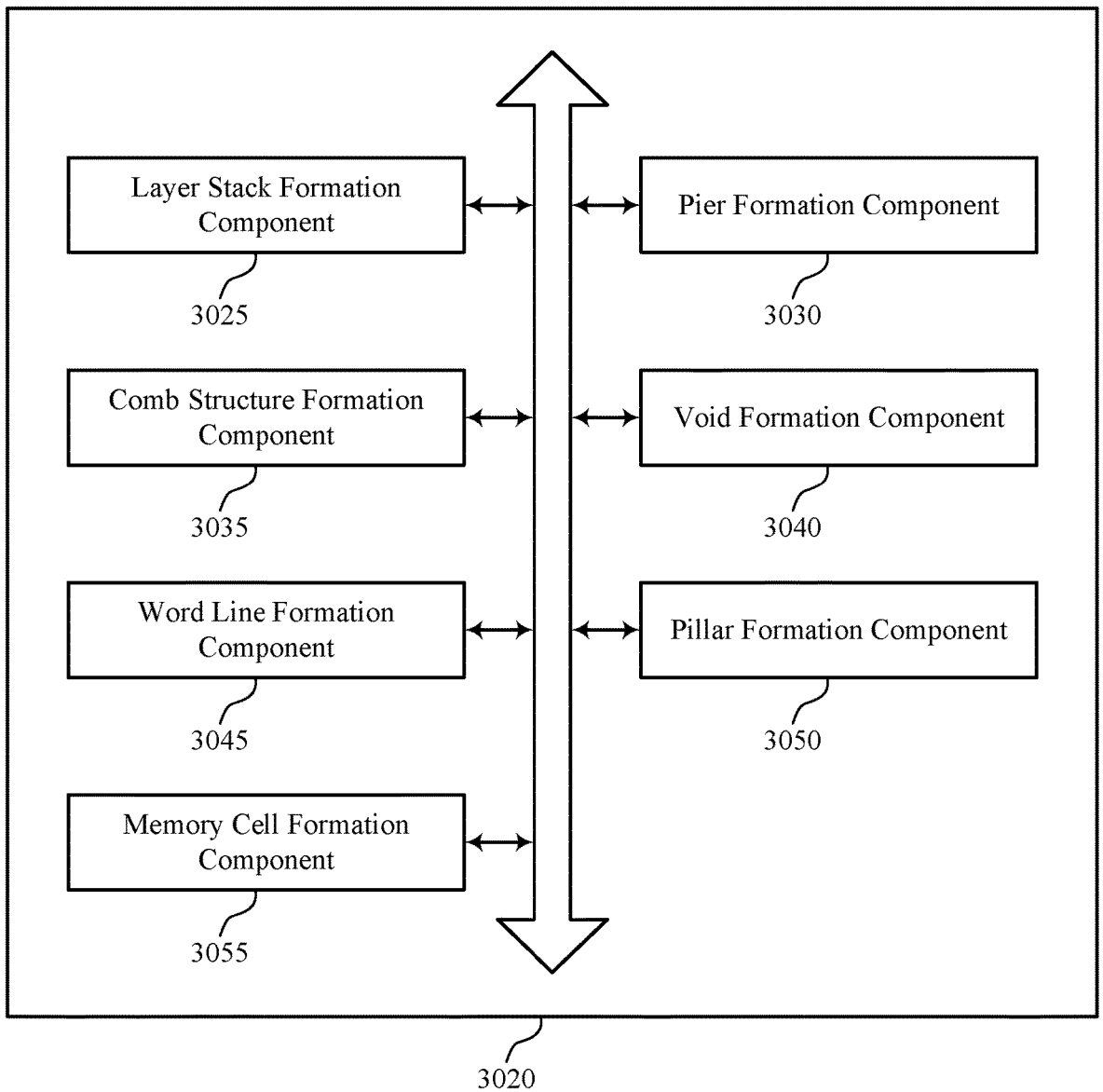
FIG. 30 shows a block diagram of a process controller that supports sparse piers for three-dimensional memory arrays in accordance with examples as disclosed herein.

FIG. 30 shows a block diagram 3000 of a process controller 3020 that supports sparse piers for three-dimensional memory arrays in accordance with examples as disclosed herein. The process controller 3020 may be an example of aspects of a process controller as described with reference to FIGS. 1 through 29. The process controller 3020, or various components thereof, may be an example of means for performing various aspects of sparse piers for three-dimensional memory arrays as described herein. For example, the process controller 3020 may include a layer stack formation component 3025, a pier formation component 3030, a comb structure formation component 3035, a void formation component 3040, a word line formation component 3045, a pillar formation component 3050, a memory cell formation component 3055, or any combination thereof. Each of these components may communicate, directly or indirectly, with one another (e.g., via one or more buses).

The layer stack formation component 3025 may be configured as or otherwise support a means for depositing a stack of layers over a substrate. The stack of layers may include alternating layers of a first material and a second material, where at least the first material may include a first dielectric material. In some examples, the first material may include an oxide. In some examples, the second material may include a nitride.

The pier formation component 3030 may be configured as or otherwise support a means for forming a plurality of piers through the stack of layers, which may be based at least in part on forming a plurality of first cavities through the stack of layers and depositing a third material in the plurality of first cavities. In some examples, the third material may include a second dielectric material. In some examples, the second dielectric material may be the same as the first dielectric material.

The comb structure formation component 3035 may be configured as or otherwise support a means for forming an interleaved pair of comb structures including a first comb structure and a second comb structure, which may be based at least in part on forming a plurality of second cavities through the stack of layers. In some examples, for both the first comb structure and the second comb structure, each of the layers of the first material and each of the layers of the second material may be in contact with each pier of the plurality of piers.

The void formation component 3040 may be configured as or otherwise support a means for forming a plurality of first voids between the layers of the first material of the first comb structure and a plurality of second voids between the layers of the first material of the second comb structure, which may be based at least in part on removing the second material of the first comb structure and the second comb structure. In some examples, forming the plurality of first voids and forming the plurality of second voids may be performed after forming the plurality of piers.

The word line formation component 3045 may be configured as or otherwise support a means for forming a plurality of first word lines and a plurality of second word lines based at least in part on depositing a conductive material in the plurality of first voids and in the plurality of second voids, respectively.

The pillar formation component 3050 may be configured as or otherwise support a means for forming a plurality of pillars in the plurality of second cavities, which may be based at least in part on depositing a second conductive material in the plurality of second cavities.

The memory cell formation component 3055 may be configured as or otherwise support a means for forming a plurality of memory cells, which may be based at least in part on depositing a memory material in the plurality of first voids and in the plurality of second voids. In some examples, each memory cell of the plurality of memory cells may be electrically coupled between a pillar of the plurality of pillars and a word line of the plurality of first word lines or the plurality of second word lines. In some examples, the memory material may include a chalcogenide.

In some examples, to support forming the plurality of pillars, the pillar formation component 3050 may be configured as or otherwise support a means for depositing a third dielectric material (e.g., after forming the plurality of first word lines and forming the plurality of second word lines) between the first comb structure and the second comb structure and between the plurality of piers. In some examples, to support forming the plurality of pillars, the pillar formation component 3050 may be configured as or otherwise support a means for forming the plurality of pillars based at least in part on forming a plurality of third cavities through the third dielectric material and depositing a second conductive material in the plurality of third cavities. In some examples, the third dielectric material may be the same as the first dielectric material, or the second dielectric material, or both.

In some examples, to support forming the plurality of memory cells, the memory cell formation component 3055 may be configured as or otherwise support a means for depositing the memory material before depositing the third dielectric material.

In some examples, to support forming the plurality of memory cells, the memory cell formation component 3055 may be configured as or otherwise support a means for depositing a fourth material in the plurality of first voids and in the plurality of second voids before depositing the third dielectric material. In some examples, to support forming the plurality of memory cells, the memory cell formation component 3055 may be configured as or otherwise support a means for forming the plurality of memory cells based at least in part on removing the fourth material after forming the plurality of pillars and depositing the memory material in the plurality of first voids and in the plurality of second voids.

In some examples, to support forming the plurality of memory cells, the memory cell formation component 3055 may be configured as or otherwise support a means for depositing a fourth material in the plurality of first voids and in the plurality of second voids before depositing the third dielectric material. In some examples, to support forming the plurality of memory cells, the memory cell formation component 3055 may be configured as or otherwise support a means for forming the plurality of memory cells based at least in part on depositing the memory material in contact with the fourth material in the plurality of first voids and in the plurality of second voids.

In some examples, to support forming the plurality of pillars, the pillar formation component 3050 may be configured as or otherwise support a means for depositing an electrode material in contact with walls of the plurality of third cavities. In some examples, to support forming the plurality of pillars, the pillar formation component 3050 may be configured as or otherwise support a means for depositing a conductive barrier material (e.g., titanium nitride, titanium silicon nitride, tungsten silicon nitride) in contact with the layers of the electrode material in each of the plurality of third cavities. In some examples, to support forming the plurality of pillars, the pillar formation component 3050 may be configured as or otherwise support a means for depositing a metal material in contact with the conductive barrier material to fill remaining portions of the plurality of third cavities.

In some examples, to support forming the plurality of first word lines and forming the plurality of second word lines, the word line formation component 3045 may be configured as or otherwise support a means for depositing a conductive barrier material (e.g., titanium nitride, titanium silicon nitride, tungsten silicon nitride, or others) in contact with the layers of the first material of the first comb structure and in contact with the layers of the first material of the second comb structure. In some examples, to support forming the plurality of first word lines and forming the plurality of second word lines, the word line formation component 3045 may be configured as or otherwise support a means for depositing a metal material in contact with the conductive barrier material to fill remaining portions of the plurality of first voids and remaining portions of the plurality of second voids.

Figure 31:
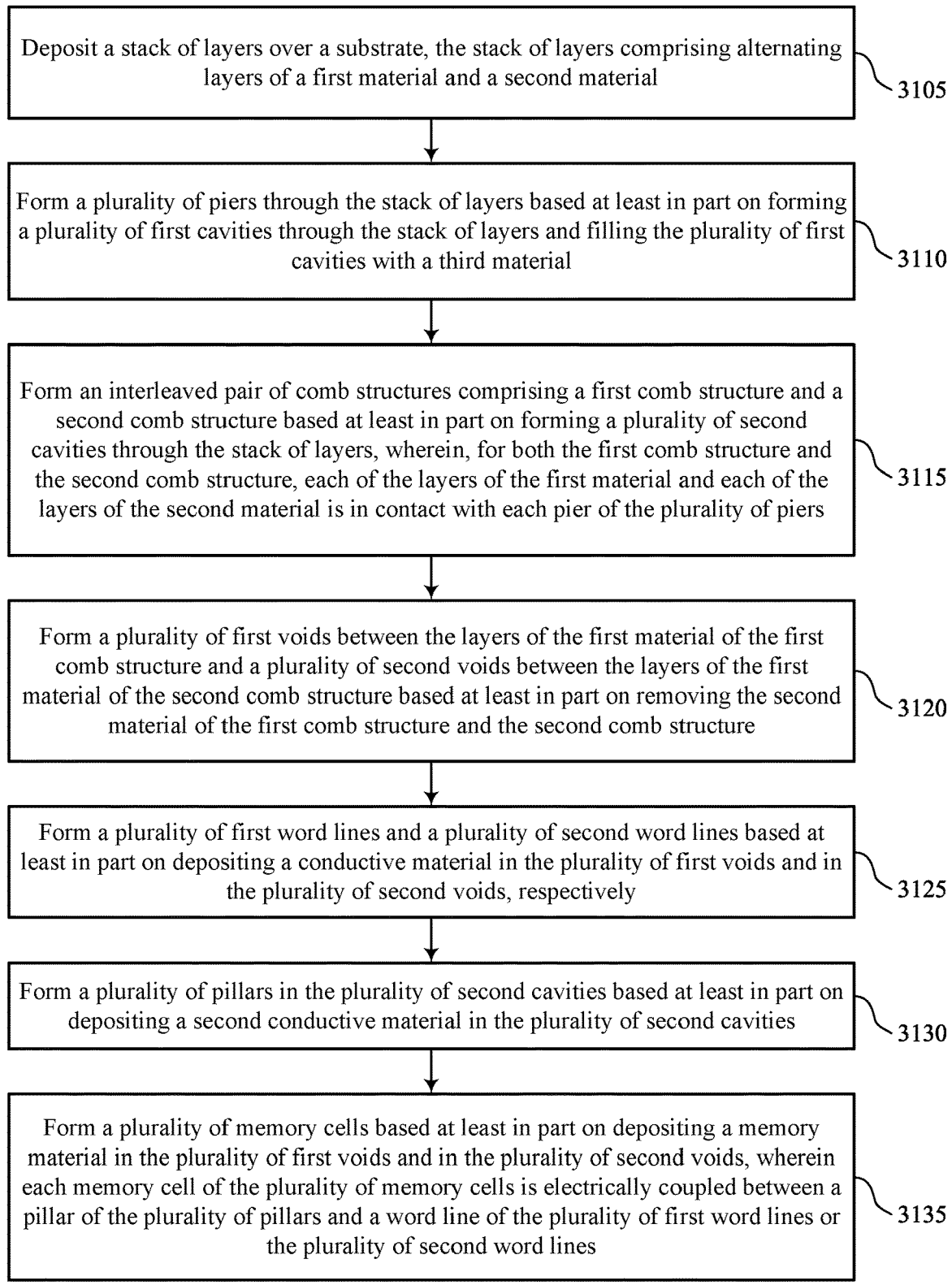
FIG. 31 shows a flowchart illustrating a method or methods that support sparse piers for three-dimensional memory arrays in accordance with examples as disclosed herein.

FIG. 31 shows a flowchart illustrating a method 3100 that supports sparse piers for three-dimensional memory arrays in accordance with examples as disclosed herein. The operations of method 3100 may be implemented by a process controller or its components as described herein. For example, the operations of method 3100 may be performed by a process controller as described with reference to FIGS. 1 through 30. In some examples, a process controller may execute a set of instructions to control the functional elements of the device to perform the described functions. Additionally, or alternatively, the process controller may perform aspects of the described functions using special-purpose hardware.

At 3105, the method may include depositing a stack of layers over a substrate, the stack of layers including alternating layers of a first material and a second material. In some examples, the first material may include a dielectric material (e.g., a first dielectric material). The operations of 3105 may be performed in accordance with examples as disclosed herein. In some examples, aspects of the operations of 3105 may be performed by a layer stack formation component 3025 as described with reference to FIG. 30.

At 3110, the method may include forming a plurality of piers through the stack of layers based at least in part on forming a plurality of first cavities through the stack of layers and depositing a third material in the plurality of first cavities. In some examples, the third material may include a dielectric material (e.g., a second dielectric material). The operations of 3110 may be performed in accordance with examples as disclosed herein. In some examples, aspects of the operations of 3110 may be performed by a pier formation component 3030 as described with reference to FIG. 30.

At 3115, the method may include forming an interleaved pair of comb structures including a first comb structure and a second comb structure based at least in part on forming a plurality of second cavities through the stack of layers, where, for both the first comb structure and the second comb structure, each of the layers of the first material and each of the layers of the second material is in contact with each pier of the plurality of piers. The operations of 3115 may be performed in accordance with examples as disclosed herein. In some examples, aspects of the operations of 3115 may be performed by a comb structure formation component 3035 as described with reference to FIG. 30.

At 3120, the method may include forming a plurality of first voids between the layers of the first material of the first comb structure and a plurality of second voids between the layers of the first material of the second comb structure based at least in part on removing the second material of the first comb structure and the second comb structure. The operations of 3120 may be performed in accordance with examples as disclosed herein. In some examples, aspects of the operations of 3120 may be performed by a void formation component 3040 as described with reference to FIG. 30.

At 3125, the method may include forming a plurality of first word lines and a plurality of second word lines based at least in part on depositing a conductive material in the plurality of first voids and in the plurality of second voids, respectively. The operations of 3125 may be performed in accordance with examples as disclosed herein. In some examples, aspects of the operations of 3125 may be performed by a word line formation component 3045 as described with reference to FIG. 30.

At 3130, the method may include forming a plurality of pillars in the plurality of second cavities based at least in part on depositing a second conductive material in the plurality of second cavities. The operations of 3130 may be performed in accordance with examples as disclosed herein. In some examples, aspects of the operations of 3130 may be performed by a pillar formation component 3050 as described with reference to FIG. 30.

At 3135, the method may include forming a plurality of memory cells based at least in part on depositing a memory material in the plurality of first voids and in the plurality of second voids, where each memory cell of the plurality of memory cells is electrically coupled between a pillar of the plurality of pillars and a word line of the plurality of first word lines or the plurality of second word lines. The operations of 3135 may be performed in accordance with examples as disclosed herein. In some examples, aspects of the operations of 3135 may be performed by a memory cell formation component 3055 as described with reference to FIG. 30.

In some examples, an apparatus as described herein may perform a method or methods, such as the method 3100. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for depositing a stack of layers over a substrate, the stack of layers including alternating layers of a first material and a second material, where the first material includes a dielectric material; forming a plurality of piers through the stack of layers based at least in part on forming a plurality of first cavities through the stack of layers and depositing a third material in the plurality of first cavities, where the third material includes a second dielectric material; forming an interleaved pair of comb structures including a first comb structure and a second comb structure based at least in part on forming a plurality of second cavities through the stack of layers, where, for both the first comb structure and the second comb structure, each of the layers of the first material and each of the layers of the second material is in contact with each pier of the plurality of piers; forming a plurality of first voids between the layers of the first material of the first comb structure and a plurality of second voids between the layers of the first material of the second comb structure based at least in part on removing the second material of the first comb structure and the second comb structure; forming a plurality of first word lines and a plurality of second word lines based at least in part on depositing a conductive material in the plurality of first voids and in the plurality of second voids, respectively; forming a plurality of pillars in the plurality of second cavities based at least in part on depositing a second conductive material in the plurality of second cavities; and forming a plurality of memory cells based at least in part on depositing a memory material in the plurality of first voids and in the plurality of second voids, where each memory cell of the plurality of memory cells is electrically coupled between a pillar of the plurality of pillars and a word line of the plurality of first word lines or the plurality of second word lines.

Aspect 2: The method, apparatus, or non-transitory computer-readable medium of aspect 1 where forming the plurality of first voids and forming the plurality of second voids is performed after forming the plurality of piers.

Aspect 3: The method, apparatus, or non-transitory computer-readable medium of any of aspects 1 through 2 where the first material includes an oxide and the second material includes a nitride.

Aspect 4: The method, apparatus, or non-transitory computer-readable medium of any of aspects 1 through 3 where the second dielectric material is the same as the first dielectric material.

Aspect 5: The method, apparatus, or non-transitory computer-readable medium of any of aspects 1 through 4 where forming the plurality of pillars includes operations, features, circuitry, logic, means, or instructions, or any combination thereof for depositing a third dielectric material, after forming the plurality of first word lines and forming the plurality of second word lines, between the first comb structure and the second comb structure and between the plurality of piers and forming the plurality of pillars based at least in part on forming a plurality of third cavities through the third dielectric material and depositing a second conductive material in the plurality of third cavities.

Aspect 6: The method, apparatus, or non-transitory computer-readable medium of aspect 5 where forming the plurality of memory cells includes operations, features, circuitry, logic, means, or instructions, or any combination thereof for depositing the memory material before depositing the third dielectric material.

Aspect 7: The method, apparatus, or non-transitory computer-readable medium of any of aspects 5 through 6 where forming the plurality of memory cells includes operations, features, circuitry, logic, means, or instructions, or any combination thereof for depositing a fourth material in the plurality of first voids and in the plurality of second voids before depositing the third dielectric material and forming the plurality of memory cells based at least in part on removing the fourth material after forming the plurality of pillars and depositing the memory material in the plurality of first voids and in the plurality of second voids.

Aspect 8: The method, apparatus, or non-transitory computer-readable medium of any of aspects 5 through 7 where forming the plurality of memory cells includes operations, features, circuitry, logic, means, or instructions, or any combination thereof for depositing a fourth material in the plurality of first voids and in the plurality of second voids before depositing the third dielectric material and forming the plurality of memory cells based at least in part on depositing the memory material in contact with the fourth material in the plurality of first voids and in the plurality of second voids.

Aspect 9: The method, apparatus, or non-transitory computer-readable medium of any of aspects 5 through 8 where the third dielectric material is the same as the second dielectric material.

Aspect 10: The method, apparatus, or non-transitory computer-readable medium of any of aspects 5 through 9 where forming the plurality of pillars includes operations, features, circuitry, logic, means, or instructions, or any combination thereof for depositing an electrode material in contact with walls of the plurality of third cavities; depositing a conductive barrier material in contact with the layers of the electrode material in each of the plurality of third cavities; and depositing a metal material in contact with the conductive barrier material to fill remaining portions of the plurality of third cavities.

Aspect 11: The method, apparatus, or non-transitory computer-readable medium of any of aspects 1 through 10 where forming the plurality of first word lines and forming the plurality of second word lines includes operations, features, circuitry, logic, means, or instructions, or any combination thereof for depositing a conductive barrier material in contact with the layers of the first material of the first comb structure and in contact with the layers of the first material of the second comb structure and depositing a metal material in contact with the conductive barrier material to fill remaining portions of the plurality of first voids and remaining portions of the plurality of second voids.

Aspect 12: The method, apparatus, or non-transitory computer-readable medium of any of aspects 1 through 11 where the memory material includes a chalcogenide.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus having a memory array formed by a process including: depositing a stack of layers over a substrate, the stack of layers including alternating layers of a first material and a second material, where the first material includes a first dielectric material; forming a plurality of piers through the stack of layers based at least in part on forming a plurality of first cavities through the stack of layers and depositing a third material in the plurality of first cavities, where the third material includes a second dielectric material; forming an interleaved pair of comb structures including a first comb structure and a second comb structure based at least in part on forming a plurality of second cavities through the stack of layers, where, for both the first comb structure and the second comb structure, each of the layers of the first material and each of the layers of the second material is in contact with each pier of the plurality of piers; forming a plurality of first voids between the layers of the first material of the first comb structure and a plurality of second voids between the layers of the first material of the second comb structure based at least in part on removing the second material of the first comb structure and the second comb structure; forming a plurality of first word lines based at least in part on depositing a conductive material in the plurality of first voids; forming a plurality of second word lines based at least in part on depositing the conductive material in the plurality of second voids; forming a plurality of pillars in the plurality of second cavities based at least in part on depositing a second conductive material in the plurality of second cavities; and forming a plurality of memory cells based at least in part on depositing a memory material in the plurality of first voids and in the plurality of second voids, where each memory cell of the plurality of memory cells is electrically coupled between a pillar of the plurality of pillars and a word line of the plurality of first word lines or the plurality of second word lines.

Aspect 14: The apparatus of aspect 13, where the plurality of first voids and the plurality of second voids are formed after the plurality of piers are formed.

Aspect 15: The apparatus of any of aspects 13 through 14, where the second dielectric material is the same as the first dielectric material.

Aspect 16: The apparatus of any of aspects 13 through 15, where the plurality of pillars are formed by a process including: depositing a third dielectric material, after forming the plurality of first word lines and forming the plurality of second word lines, between the first comb structure and the second comb structure and between the plurality of piers; and forming the plurality of pillars based at least in part on forming a plurality of third cavities through the third dielectric material and depositing a second conductive material in the plurality of third cavities.

Aspect 17: The apparatus of aspect 16, where the plurality of memory cells are formed by a process including: depositing the memory material before depositing the third dielectric material.

Aspect 18: The apparatus of any of aspects 16 through 17, where the plurality of memory cells are formed by a process including: depositing a fourth material in the plurality of first voids and in the plurality of second voids before depositing the third dielectric material; and forming the plurality of memory cells based at least in part on depositing the memory material in contact with the fourth material in the plurality of first voids and in the plurality of second voids.

Aspect 19: The apparatus of any of aspects 16 through 18, where the third dielectric material is the same as the second dielectric material.

Aspect 20: The apparatus of any of aspects 16 through 19, where the plurality of pillars are formed by a process including: depositing an electrode material in contact with walls of the plurality of third cavities; depositing a conductive barrier material in contact with the layers of the electrode material in each of the plurality of third cavities; and depositing a metal material in contact with the conductive barrier material to fill remaining portions of the plurality of third cavities.

Aspect 21: The apparatus of any of aspects 13 through 20, where the plurality of first word lines and the plurality of second word lines are formed by a process including: depositing a conductive barrier material in contact with the layers of the first material of the first comb structure and in contact with the layers of the first material of the second comb structure; and depositing a metal material in contact with the conductive barrier material to fill remaining portions of the plurality of first voids and remaining portions of the plurality of second voids.

Aspect 22: The apparatus of any of aspects 13 through 21, where the memory material includes a chalcogenide.

An apparatus is described. The following provides an overview of aspects of the apparatus as described herein:

Aspect 23: An apparatus, including: a plurality of first dielectric comb structures distributed along a height dimension relative to a substrate; a plurality of second dielectric comb structures distributed along the height dimension, where each second dielectric comb structure of the plurality of second dielectric comb structures is interleaved with a respective first dielectric comb structure of the plurality of first dielectric comb structures; a plurality of dielectric pier structures, where each dielectric pier structure of the plurality of dielectric pier structures is in contact with each first dielectric comb structure of the plurality of first dielectric comb structures and in contact with each second dielectric comb structure of the plurality of second dielectric comb structures; a plurality of conductive pillars between the plurality of first dielectric comb structures and the plurality of second dielectric comb structures; a plurality of first word lines formed between respective first dielectric comb structures of the plurality of first dielectric comb structures; a plurality of second word lines formed between respective second dielectric comb structures of the plurality of second dielectric comb structures; a plurality of first memory cells formed between respective first dielectric comb structures of the plurality of first dielectric comb structures, each first memory cell electrically coupled between a word line of the plurality of first word lines and a pillar of the plurality of conductive pillars; a plurality of second memory cells formed between respective second dielectric comb structures of the plurality of second dielectric comb structures, each second memory cell electrically coupled between a word line of the plurality of second word lines and a pillar of the plurality of conductive pillars; and a plurality of dielectric portions, different than the plurality of dielectric pier structures, between conductive pillars of the plurality of conductive pillars and between the plurality of first dielectric comb structures and the plurality of second dielectric comb structures.

Aspect 24: The apparatus of aspect 23, where the plurality of dielectric pier structures and the plurality of dielectric portions include a same dielectric material.

Aspect 25: The apparatus of any of aspects 23 through 24, where the plurality of first memory cells and the plurality of second memory cells include a chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   depositing a stack of layers over a substrate, the stack of layers comprising alternating layers of a first material and a second material, wherein the first material comprises a first dielectric material;
   forming a plurality of piers through the stack of layers based at least in part on forming a plurality of first cavities through the stack of layers and depositing a third material in the plurality of first cavities, wherein the third material comprises a second dielectric material;
   forming an interleaved pair of comb structures comprising a first comb structure and a second comb structure based at least in part on forming a plurality of second cavities through the stack of layers, wherein, for both the first comb structure and the second comb structure, each of the layers of the first material and each of the layers of the second material is in contact with each pier of the plurality of piers;
   forming a plurality of first voids between the layers of the first material of the first comb structure and a plurality of second voids between the layers of the first material of the second comb structure based at least in part on removing the second material of the first comb structure and the second comb structure;
   forming a plurality of first word lines and a plurality of second word lines based at least in part on depositing a conductive material in the plurality of first voids and in the plurality of second voids, respectively;
   forming a plurality of pillars in the plurality of second cavities based at least in part on depositing a second conductive material in the plurality of second cavities; and
   forming a plurality of memory cells based at least in part on depositing a memory material in the plurality of first voids and in the plurality of second voids, wherein each memory cell of the plurality of memory cells is electrically coupled between a pillar of the plurality of pillars and a word line of the plurality of first word lines or the plurality of second word lines.

2. The method of claim 1, wherein forming the plurality of first voids and forming the plurality of second voids is performed after forming the plurality of piers.

3. The method of claim 1, wherein:
the first material comprises an oxide, and
the second material comprises a nitride.

4. The method of claim 1, wherein the second dielectric material is the same as the first dielectric material.

5. The method of claim 1, wherein forming the plurality of pillars comprises:
depositing a third dielectric material, after forming the plurality of first word lines and forming the plurality of second word lines, between the first comb structure and the second comb structure and between the plurality of piers; and
forming the plurality of pillars based at least in part on forming a plurality of third cavities through the third dielectric material and depositing the second conductive material in the plurality of third cavities.

6. The method of claim 5, wherein forming the plurality of memory cells comprises:
depositing the memory material before depositing the third dielectric material.

7. The method of claim 5, wherein forming the plurality of memory cells comprises:
depositing a fourth material in the plurality of first voids and in the plurality of second voids before depositing the third dielectric material; and
forming the plurality of memory cells based at least in part on removing the fourth material after forming the plurality of pillars and depositing the memory material in the plurality of first voids and in the plurality of second voids.

8. The method of claim 5, wherein forming the plurality of memory cells comprises:
depositing a fourth material in the plurality of first voids and in the plurality of second voids before depositing the third dielectric material; and
forming the plurality of memory cells based at least in part on depositing the memory material in contact with the fourth material in the plurality of first voids and in the plurality of second voids.

9. The method of claim 5, wherein the third dielectric material is the same as the second dielectric material.

10. The method of claim 5, wherein forming the plurality of pillars comprises:
depositing an electrode material in contact with walls of the plurality of third cavities;
depositing a conductive barrier material in contact with the layers of the electrode material in each of the plurality of third cavities; and
depositing a metal material in contact with the conductive barrier material to fill remaining portions of the plurality of third cavities.

11. The method of claim 1, wherein forming the plurality of first word lines and forming the plurality of second word lines comprises:
depositing a conductive barrier material in contact with the layers of the first material of the first comb structure and in contact with the layers of the first material of the second comb structure; and
depositing a metal material in contact with the conductive barrier material to fill remaining portions of the plurality of first voids and remaining portions of the plurality of second voids.

12. The method of claim 1, wherein the memory material comprises a chalcogenide.

* * * * *